United States Patent
Mori et al.

(10) Patent No.: US 9,423,591 B2
(45) Date of Patent: Aug. 23, 2016

(54) METAL ELASTIC MEMBER, MINIATURE MACHINE, METHOD OF MANUFACTURING MINIATURE MACHINE, SWING CONTROL DEVICE AND SWING CONTROL METHOD

(71) Applicant: HOKUYO AUTOMATIC CO., LTD., Osaka (JP)

(72) Inventors: Toshihiro Mori, Takatsuki (JP); Norihiro Asada, Osaka (JP); Kazuo Takai, Sakai (JP)

(73) Assignee: HOKUYO AUTOMATIC CO., LTD., Osaka (JP)

( * ) Notice: Subject to any disclaimer, the term of this patent is extended or adjusted under 35 U.S.C. 154(b) by 243 days.

(21) Appl. No.: 14/058,814

(22) Filed: Oct. 21, 2013

(65) Prior Publication Data

US 2014/0132187 A1     May 15, 2014

(30) Foreign Application Priority Data

Nov. 9, 2012   (JP) ................................ 2012-247796

(51) Int. Cl.
*G02B 26/10*     (2006.01)
*G02B 7/182*     (2006.01)
(Continued)

(52) U.S. Cl.
CPC .......... *G02B 7/1821* (2013.01); *B81C 1/00674* (2013.01); *F16F 1/14* (2013.01); *G02B 26/0833* (2013.01); *H02K 33/02* (2013.01); *B81B 2201/042* (2013.01); *B81B 2203/0154* (2013.01)

(58) Field of Classification Search
CPC .. G02B 6/0028; G02B 6/0088; G02B 21/002; G02B 21/26; G02B 26/105; G02B 26/0858; G02B 26/10; G02B 6/356; G02B 6/29311; G02B 6/29313; G02B 6/3588; G02B 6/3512; G02B 6/3584; G02B 7/1821; G02B 21/0028; G02B 26/127; G02B 27/0031; G02B 27/4227; G02B 27/4244

USPC ........... 318/119, 558, 686; 359/199.1, 199.3, 359/199.4; 310/36, 38; 267/154
See application file for complete search history.

(56) References Cited

U.S. PATENT DOCUMENTS 5,606,447 A * 2/1997 Asada et al. ............... 359/199.1
6,201,629 B1   3/2001 McClelland et al.
(Continued)

FOREIGN PATENT DOCUMENTS

DE     102 05 207 A1    8/2003
JP     A-09-281417      10/1997
(Continued)

OTHER PUBLICATIONS

Feb. 5, 2014 Search Report issued in European Patent Application No. 13190418.
(Continued)

*Primary Examiner* — Bentsu Ro
(74) *Attorney, Agent, or Firm* — Oliff PLC

(57) ABSTRACT

A metal elastic member to be used for beams 4 for supporting a movable unit 3 at respective ends with respect to a fixed unit 2 in a miniature machine including at least one movable unit 3, the fixed unit 2 and the beams 4, and capable of swinging the movable unit about an axis P with the beams 4 serving as torsional rotation axes, includes a metal bar 4a having a predetermined length, a fixed unit pad 4b that is provided at a first end of the metal bar 4a and is fixed to the fixed unit 2, and a movable unit pad 4c formed on the other end side of the metal bar 4a and fixed to the movable unit 3. At least the metal bar 4a is molded to have a sectional area of 1 mm$^2$ or less by using a physical or chemical processing method excluding a mechanical processing method and swings the movable unit 3 within a frequency of 150 Hz to 500 Hz.

13 Claims, 15 Drawing Sheets

(51) Int. Cl.
  *F16F 1/14* (2006.01)
  *H02K 33/02* (2006.01)
  *G02B 26/08* (2006.01)
  *B81C 1/00* (2006.01)

(56) References Cited

U.S. PATENT DOCUMENTS

| | | | |
|---|---|---|---|
| 6,758,571 B2* | 7/2004 | Heaton | 359/872 |
| 7,116,457 B2* | 10/2006 | Nomura et al. | 359/212.1 |
| 7,433,107 B2* | 10/2008 | Ji et al. | 359/202.1 |
| 7,961,370 B2* | 6/2011 | Jerman | G02B 26/105 359/224.1 |
| 2003/0006360 A1 | 1/2003 | Hatam-Tabrizi et al. | |
| 2004/0119002 A1 | 6/2004 | Bush et al. | |
| 2005/0128546 A1 | 6/2005 | Kandori et al. | |
| 2007/0268950 A1 | 11/2007 | Spinelli et al. | |
| 2008/0024590 A1 | 1/2008 | Nakajima | |
| 2009/0153933 A1 | 6/2009 | Tsuchiya et al. | |
| 2013/0286151 A1 | 10/2013 | Wakabayashi et al. | |

FOREIGN PATENT DOCUMENTS

| | | |
|---|---|---|
| JP | A-2001-226718 | 8/2001 |
| JP | A-2003-084226 | 3/2003 |
| JP | A-2004-258548 | 9/2004 |
| JP | A-2008-040228 | 2/2008 |
| JP | A-2009-175368 | 8/2009 |
| JP | A-2012-170196 | 9/2012 |
| WO | 2012/093653 A1 | 7/2012 |

OTHER PUBLICATIONS

Mar. 17, 2015 Office Action issued in European Patent Application No. 13190418.7.
Mar. 20, 2015 Search Report issued in European Patent Application No. 14196493.2.

* cited by examiner

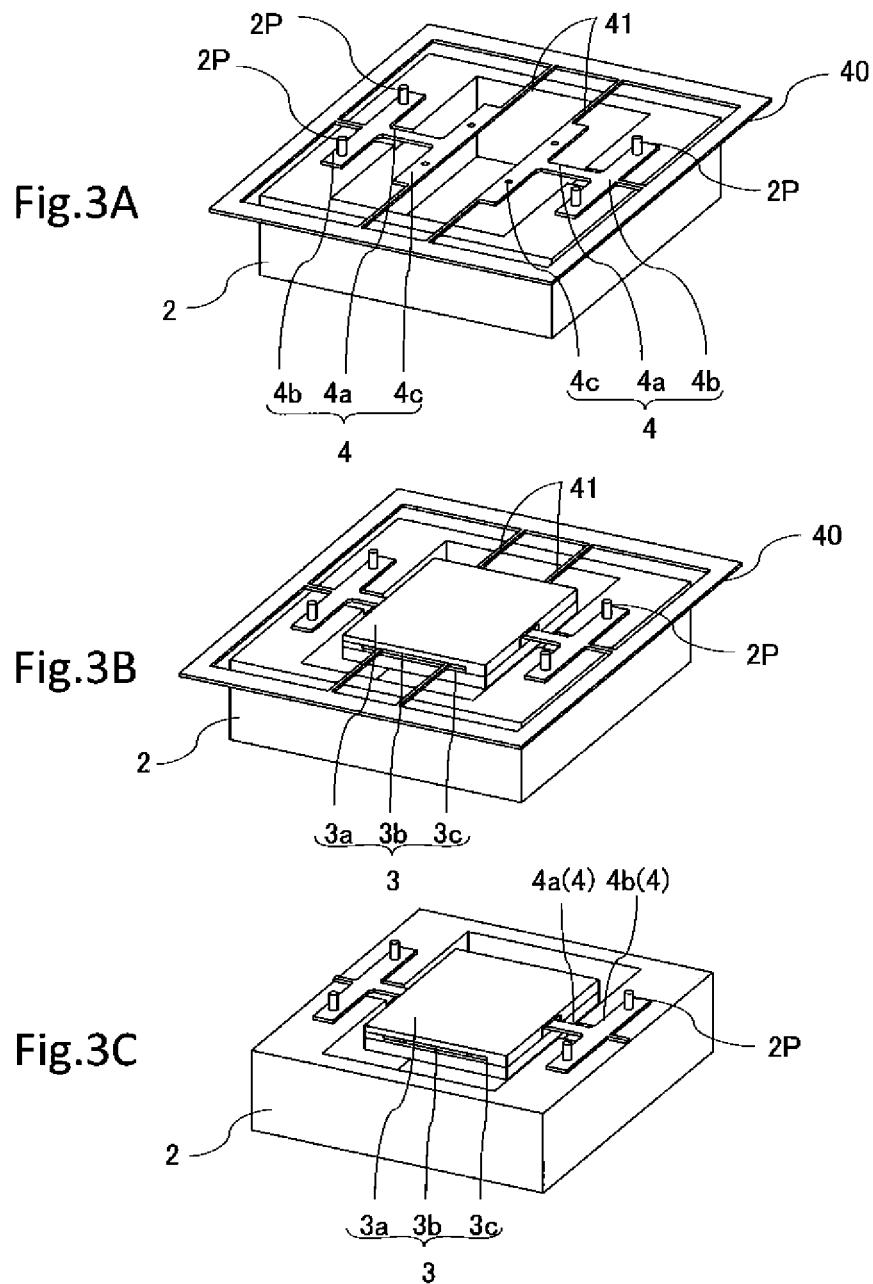

METAL ELASTIC MEMBER, MINIATURE MACHINE, METHOD OF MANUFACTURING MINIATURE MACHINE, SWING CONTROL DEVICE AND SWING CONTROL METHOD

This application is based on an application No. 2012-247796 filed in Japan, the contents of which are hereby incorporated by reference.

BACKGROUND OF THE INVENTION

1. Field of the invention

The present invention relates to a metal elastic member, a miniature machine, a method of manufacturing a miniature machine, a swing control device, and a swing control method, and, for example, relates to a metal elastic member, a miniature machine, a method of manufacturing a miniature machine, a swing control device, and a swing control method which are used for repetitively scanning light within a predetermined angle range.

2. Description of the related art

A miniature machine such as a scanning light deflection element to be manufactured by using the MEMS (Micro Electro Mechanical Systems) technique includes at least one movable unit, a fixed unit, and paired beams for supporting the movable unit at the respective ends with respect to the fixed unit. The movable unit is supported by the fixed unit so as to be swingable about an axis with paired beams serving as torsional rotation axes. In other words, the beams serve as torsion beams in a gimbal structure.

For example, in a miniature machine in which the movable unit is configured by a light deflecting mirror for deflecting and scanning incident light and a flat coil formed on a back face of the light deflecting mirror and paired permanent magnets are disposed in the fixed unit so as to have the coil sandwiched therebetween, Lorentz force generated by an alternating current flowing to the coil and a magnetic field formed by the permanent magnets acts on the coil so that the movable unit supported by the beams, that is, the light deflecting mirror is repetitively swung.

Japanese Unexamined Patent Publication No. 2003-84226 proposes an optical scanner having a movable unit and a beam formed integrally by applying a semiconductor manufacturing technique to a single crystal silicon substrate.

Japanese Unexamined Patent Publication No. 9-281417 proposes a micro mirror device in which a beam is fabricated by using a conductive amorphous aluminum alloy in a monolithic manufacturing process.

Japanese Unexamined Patent Publication No. 2009-175368 proposes a vibration mirror including a beam obtained by pressing pure titanium or a titanium alloy.

Japanese Unexamined Patent Publication No. 2008-40228 discloses a miniature machine including a beam formed by a conductive polymer as a suitable beam for driving a movable unit at a low frequency of 150 Hz or less. The miniature machine is used for a bar code reader or the like and serves to scan measurement light at a light deflection angle of approximately 50°.

Moreover, Japanese Unexamined Patent Publication Nos. 2004-258548 and 2012-170196 disclose a control method of variably controlling the value of current applied to a coil in order to control to swing the movable unit of the miniature machine at certain amplitude.

In a case where there is configured a small-sized scanning type distance measuring device using the light deflecting mirror or an obstacle detecting device using the scanning type distance measuring device, it is necessary to swing a deflecting mirror of several mm square at a comparatively low frequency of 150 Hz to 500 Hz, thereby scanning with measurement light within a scanning angle range of 45°, for example.

However, the beam fabricated by using a silicon material described in Japanese Unexamined Patent Publication No. 2003-84226 is a suitable material for a case where it is necessary to drive the movable unit at a comparatively high frequency, and has a problem in that stable driving cannot be carried out at a frequency of 500 Hz or less. Since the silicon material causes cleavage comparatively easily, moreover, there is also a problem in that the silicon material is hard to be used for a demand of a shock resistance.

The beam using the conductive amorphous aluminum alloy described in Japanese Unexamined Patent Publication No. 9-281417 has a problem in that the beam is fabricated in the monolithic manufacturing process so that a manufacturing cost is increased, and furthermore, has a problem in that the beam is hard to use in measurement requiring a beam diameter to some extent because a size including a light deflecting mirror of about 10 to 20 µm square is very small.

Referring to the beam obtained by pressing a metal described in Japanese Unexamined Patent Publication No. 2009-175368, a large number of minute concavo-convex portions or scratches are formed on a surface thereof in the working and stress concentrates depending on stress amplitude thereon. For this reason, there is a problem in that the minute concavo-convex portions or scratches act as starting points to grow a crack due to repetitive use and a fatigue failure thus tends to occur.

In particular, an optical scanner for scanning with measurement light to detect the presence of an obstacle based on reflected light corresponding to the measurement light is operated continuously for a long period of time. For this reason, even if the optical scanner is used at a frequency of 100 Hz, for example, it is necessary to resist stress amplitude three billion times per year.

For this reason, these metal components are usually subjected to a life test tens of thousands of times to hundreds of thousands of times or millions of times to tens of millions of times, and the life test for several tens of hours or several hundreds of hours in conversion into a time, and are used within a range in which a safety factor calculated based on the result is taken into consideration. In recent years, however, it is indicated that the safety factor is lacking in evaluation depending on stress amplitude millions of times to tens of millions of times.

A crack originating from a scratch on a surface or the like is referred to as a high cycle fatigue and a crack originating from a crystal defect in an inner part or the like is referred to as a Very High Cycle Fatigue, and a test hundreds of millions of times or billions of times of tests are required for evaluation. Consequently, a time required for the test also becomes enormous and it is actually difficult to guarantee a life to that extent.

The beam formed by a conductive polymer described in Japanese Unexamined Patent Publication No. 2008-40228 exhibits a preferred characteristic at a low frequency of 150 Hz or less. However, there is a problem in that stable driving cannot be carried out at a frequency of 150 Hz to 500 Hz, and a stress rupture is apt to be caused if hardness of a polymer is increased to aim at the stable driving.

As described in Japanese Unexamined Patent Publication Nos. 2004-258548 and 2012-170196, in the case where the value of current applied to the coil is variably controlled in order to control to swing the movable unit of the miniature machine at certain amplitude, there is required a complicated large-scale power supply circuit for accurately controlling the applied current value including a factor for a change in a temperature characteristic of a circuit element or the like. Consequently, there is also a problem in that a cost is increased, and furthermore, a large installation space is required.

SUMMARY OF THE INVENTION

It is an object of the present invention to provide a metal elastic member constituting a beam serving as a torsional rotation axis capable of swinging a movable unit within a comparatively low frequency range and having a long life and a high reliability, a miniature machine using the metal elastic member, a method of manufacturing the miniature machine, a swing control device, and a swing control method.

A characteristic structure of the metal elastic member according to the present invention is directed to a metal elastic member to be used for paired beams for supporting a movable unit at respective ends with respect to a fixed unit in a miniature machine including at least one movable unit, the fixed unit and the beams, and capable of swinging the movable unit about an axis with the beams serving as torsional rotation axes. The metal elastic member includes a metal bar having a predetermined length which swings the movable unit, a fixed unit pad that is provided at a first end of the metal bar and is fixed to the fixed unit, and a movable unit pad that is provided at a second end of the metal bar and is fixed to the movable unit, and at least the metal bar is molded to have a sectional area of 1 mm$^2$ or less by using a physical or chemical processing method excluding a mechanical processing method.

It is preferable that a frame, a pair of the metal bars disposed symmetrically on a straight line in the frame, and a plurality of support units for coupling the frame to each of the pads should be formed integrally by using the physical or chemical processing method excluding the mechanical processing method.

It is further preferable that the metal elastic member should be configured by any of metals including a stainless material, a carbon tool steel material, and a cold-reduced carbon steel sheet material which are rolled by a tension annealing method.

The physical or chemical processing method includes a focused ion beam method, an etching method and a plating method.

A characteristic structure of the miniature machine according to the present invention is directed to a miniature machine including at least one movable unit, a fixed unit and paired beams for supporting the movable unit at the respective ends with respect to the fixed unit, and capable of swinging the movable unit about an axis with the beams serving as torsional rotation axes, and the beams include a metal bar which is molded to have a sectional area of 1 mm$^2$ or less by using a physical or chemical processing method excluding a mechanical processing method and swings the movable unit.

Moreover, it is preferable that a coil should be formed in the movable unit, a magnetic field forming unit should be provided in the fixed unit, the movable unit should be swung by electromagnetic force generated by a current flowing to the coil and a magnetic field formed by the magnetic field forming unit, and the beam should serve as a supporter of the movable unit, a conductor for flowing current to the coil, and a spring for returning the movable unit to a reference position.

It is further preferable that the movable unit should be further provided with a light deflecting surface for reflecting incident light to deflect the reflected light and scan with the light.

A characteristic structure of a method of manufacturing a miniature machine according to the present invention is directed to a method of manufacturing a miniature machine including at least one movable unit, a fixed unit and paired beams for supporting the movable unit at the respective ends with respect to the fixed unit and capable of swinging the movable unit about an axis with the beams serving as torsional rotation axes, the method including positioning and disposing the metal elastic member described above in the fixed unit and/or the movable unit in a state where the metal bar and each of the pads are supported by a frame between the fixed unit and the movable unit, fixing the fixed unit and/or the movable unit to each pad and then cutting each support unit, thereby separating the frame.

A characteristic structure of the swing control device according to the present invention is directed to a swing control device for controlling to swing the movable unit of the miniature machine, and the swing control device including an amplitude detector having a light receiving portion for monitoring which detects a monitor light guided from the movable unit along an optical axis having an angle varied with the swinging movement of the movable unit in an inclined direction to a swinging direction with respect to a swinging center direction of the movable unit, and an amplitude detecting circuit for detecting two sections having a long cycle section and a short cycle section which constitute one swing cycle of the movable unit based on the monitor light detected by the light receiving portion for monitoring, and an amplitude controller for variably controlling a frequency while maintaining a current value of a current to be applied to the coil in such a manner that a time ratio of the long cycle section and the short cycle section which are detected by the amplitude detector has a target value.

It is preferable that a first light deflecting surface for deflecting measurement light irradiated from a measurement light source to scan a measurement space and for deflecting reflected light of the measurement light toward a light receiving portion for measurement should be formed on a surface of the movable unit, and a second light deflecting surface should be formed on a back face of the movable unit, the amplitude detector should further include a monitor light source for irradiating monitor light toward the second light deflecting surface, and reflected light thereof should be received by the light receiving portion for monitoring.

It is more preferable that there should be provided a swing phase detector for detecting a swing phase of the movable unit, and a synchronization signal output unit for regulating a measurement time through the measurement light, in synchronization with the swing phase detected by the swing phase detector.

It is further preferable that there should be provided a swing phase detector for detecting a swing phase of the movable unit, and a phase signal output unit for outputting the swing phase detected by the swing phase detector, in synchronization with a measurement time through the measurement light.

A characteristic structure of the swing control method according to the present invention is directed to a swing control method of controlling to swing the movable unit of the miniature machine, the method including detecting a monitor light guided from the movable unit along an optical axis having an angle varied with the swinging movement of the movable unit in an inclined direction to a swinging direction with respect to a swinging center direction of the movable unit, detecting two sections having a long cycle section and a short cycle section which constitute one swing cycle of the movable unit based on the detected monitor light, and variably controlling a frequency while maintaining a current value of a current to be applied to the coil in such a manner that a time ratio of the long cycle section and the short cycle section which are detected has a target value.

BRIEF DESCRIPTION OF THE DRAWINGS

FIGS. 3A to 3C are views for explaining an attaching process for attaching a movable unit to a fixed unit with the metal elastic member being interposed therebetween;

DESCRIPTION OF THE EMBODIMENTS

A metal elastic member, a miniature machine and a method of manufacturing a miniature machine according to the present invention will be described below with reference to the drawings.

Figure 1:
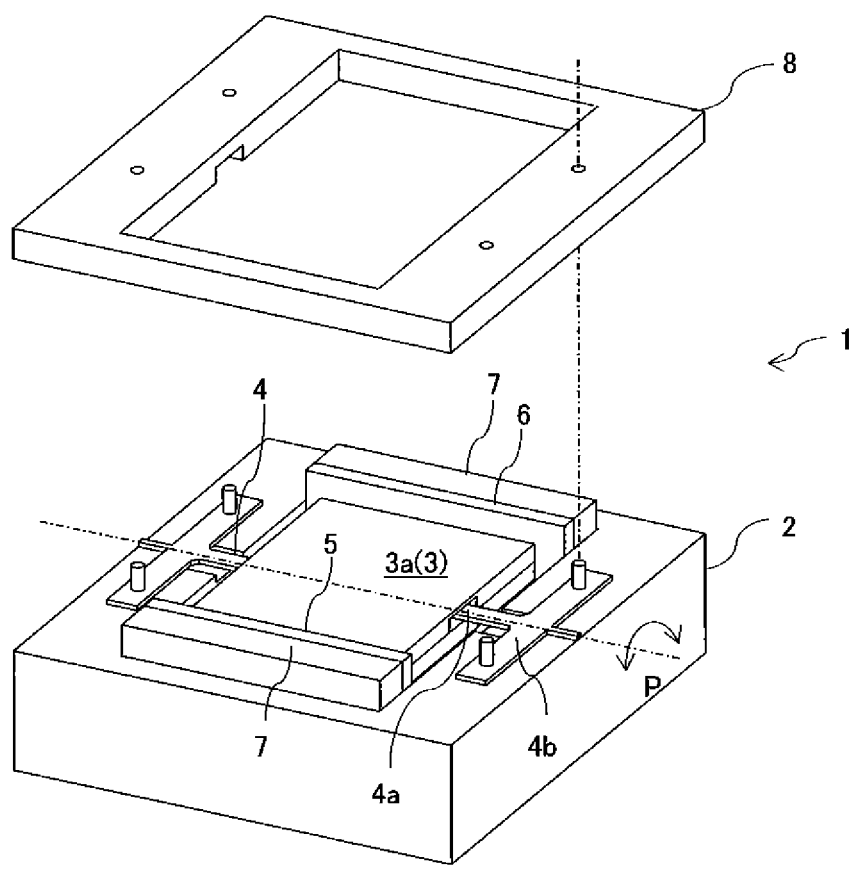
FIG. 1 is a perspective view showing a miniature machine according to the present invention.
Figure 4:
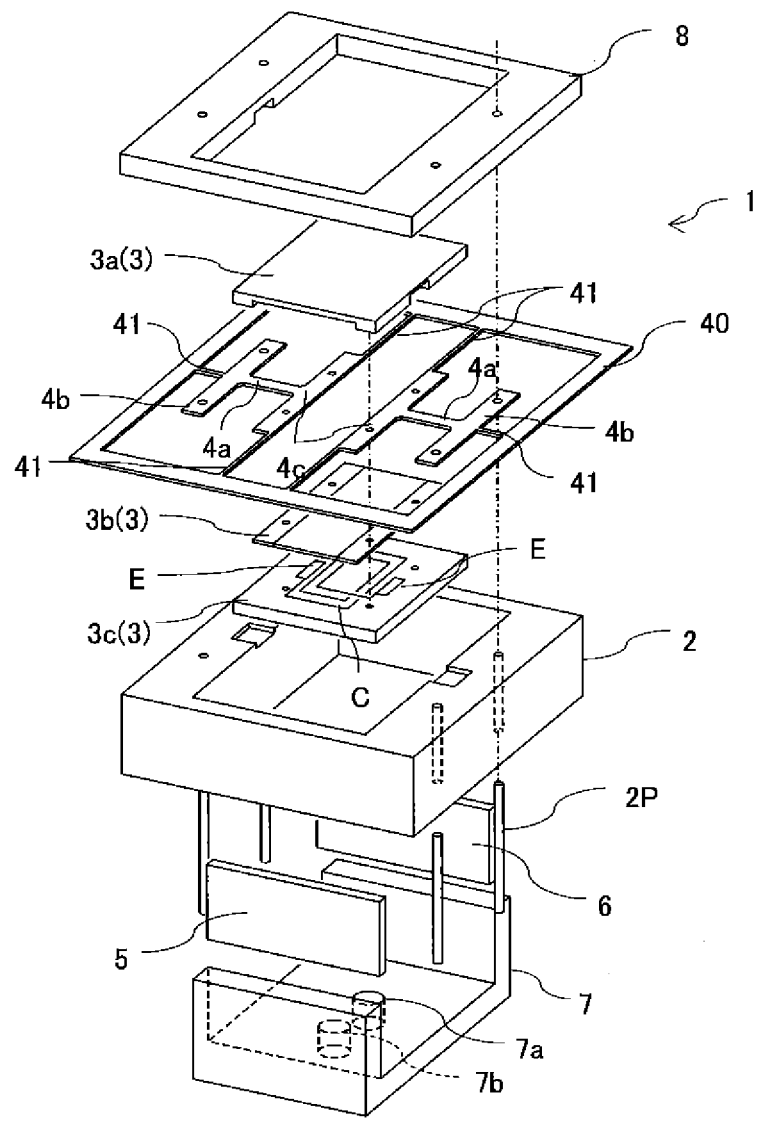
FIG. 4 is an exploded perspective view showing the miniature machine according to the present invention.

FIGS. 1 and 4 show a miniature machine 1 to be used for a scanning type distance measuring device or the like. The miniature machine 1 includes a frame serving as a fixed unit 2, a flat plate body serving as a movable unit 3, paired beams 4, 4 for supporting the movable unit 3 so as to be swingable about an axis P with respect to the fixed unit 2, permanent magnets 5 and 6 that are disposed at the respective ends of the movable unit 3 with the beams 4, 4 being sandwiched therebetween, an upper cover 8, and the like.

The fixed unit 2 is configured by a rectangular parallelepiped member made of resin such as polycarbonate. An open space is hollowed out in a thickness direction in a slightly larger area than the movable unit 3 as seen on a plane in a central part of the fixed unit 2, and the movable unit 3 is disposed in the open space.

The beams 4, 4 are configured by a metal elastic member. The metal elastic member includes a metal bar 4a having a predetermined length, a fixed unit pad 4b which is provided at a first end of the metal bar 4a and is fixed to the fixed unit 2, and a movable unit pad 4c which is provided at a second end of the metal bar 4a and is fixed to the movable unit 3.

The permanent magnets 5 and 6 are disposed opposite to each other in a magnetic retainer 7 taking a sectional shape of "U" and configured by a member having high magnetic permeability in such a manner that the permanent magnet 5 serves as the north pole and the permanent magnet 6 serves as the south pole. The permanent magnets 5 and 6 are inserted from below and fixed into the open space in the fixed unit 2 so as to have the movable unit 3 sandwiched therebetween.

The movable unit 3 includes a deflecting mirror 3a that is configured by a glass substrate or a silicon substrate with gold, aluminum, or the like being deposited thereonto, a coil substrate 3c that is configured by a glass epoxy substrate with a copper wire coil C and electrode pads E being printed thereon, and a spacer 3b that is also made of glass epoxy and is interposed therebetween.

The movable unit pads 4c of the paired beams 4, 4 are positioned so as to be in contact with the electrode pads E, respectively, and are bonded and fixed between the deflecting mirror 3a and the coil substrate 3c by a conductive adhesive agent. Alternatively, the coil substrate 3c may be configured by a multiple layered substrate having substrate layers that are made of epoxy resin or the like, and are provided respectively with coil patterns and coils coupled together by means of a via.

When an alternating current is applied to the coil C through paired beams 4, 4, Lorentz force acts on the coil C by the alternating current flowing to the coil C and a magnetic field formed by the permanent magnets 5 and 6 provided on the fixed unit 2 so that the movable unit 3 supported by the beams 4, 4 is repetitively swung by the Lorentz force.

In other words, the miniature machine 1 includes at least one movable unit 3, the fixed unit 2 and the paired beams 4, 4 supporting the movable unit 3 at the respective ends with respect to the fixed unit 2. The movable unit 3 is configured to be swingable about the axis P with the beams 4 serving as torsional rotation axes. The beams 4, 4 each serve as a supporter of the movable unit 3, a conductor for flowing current to the coil C, and a spring for returning the movable unit 3 to a reference position. The movable unit 3 is further provided with a light deflecting surface for reflecting incident light to deflect the reflected light and scan with the light.

A frequency for driving to swing the movable unit 3, that is, a frequency of the alternating current to be applied to the coil C is preferably set to be a frequency which is slightly shifted from a mechanical resonance frequency of the beams 4, 4 including the movable unit 3, and can be set within a range of 10 Hz to approximately 1.8 KHz depending on a size of the movable unit 3, a sectional area and a length of the metal bar 4a, and a physical characteristic thereof.

For example, in the case where an area of a movable mirror is 12 mm×12 mm and the case where the metal elastic member according to the present invention is used for the beams 4, a frequency of 150 Hz to 500 Hz, is suitable.

Figure 2A:
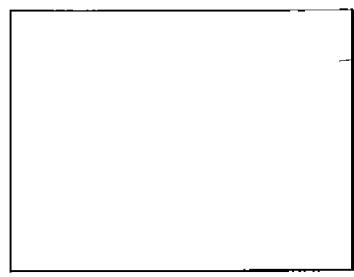
FIGS. 2A to 2E are views for explaining a process for fabricating a metal elastic member according to the present invention.
Figure 2B:
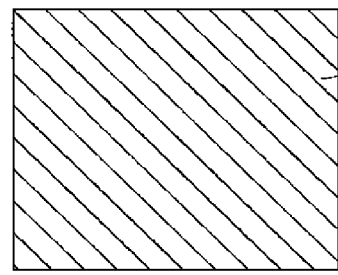
Figure 2C:
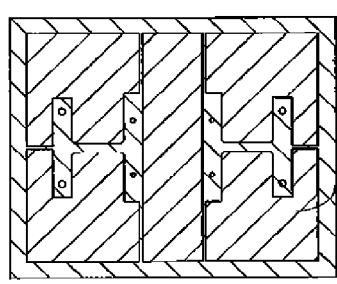
Figure 2D:
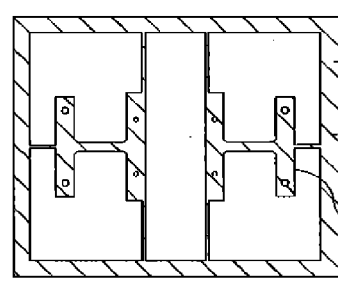
Figure 2E:
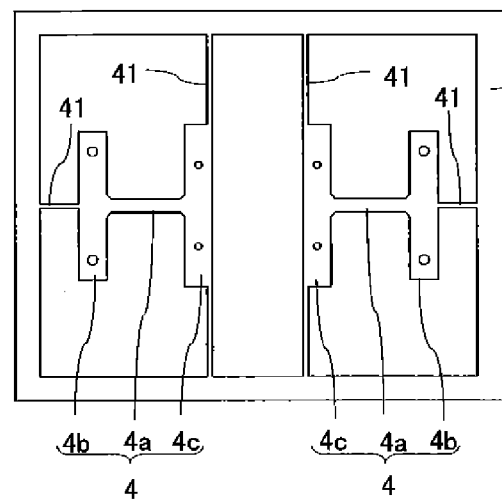

As shown in FIG. 2E, in the beams 4, 4, a pair of the metal bars 4a having the fixed unit pad 4b provided at the first end and the movable unit pad 4c provided at the second end are disposed symmetrically on a straight line in a frame 40 and the respective pads 4b and 4c are formed integrally so as to be fixed to the frame 40 through a support unit 41.

As shown in FIG. 3A, first of all, paired positioning pins 2p provided on the fixed unit 2 are fitted, bonded and fixed into paired positioning hole portions formed on the respective fixed unit pad 4b.

As shown in FIG. 3B, next, paired positioning pins formed on a back face of the deflecting mirror 3a are fitted from above paired positioning hole portions provided on the movable unit pad 4c, the spacer 3b is then put via the open space from below the movable unit pad 4c, the positioning pins of the deflecting mirror 3a are further fitted into paired positioning hole portions formed on the coil substrate 3c, and they are bonded and fixed with an adhesive agent, respectively.

As shown in FIG. 3C, thereafter, each support unit 41 is cut so that the frame 40 is removed, and an upper cover 8 is further put from above the fixed unit 2 so that the fixed unit pad 4b is fixed reliably. The movable unit 3 can be supported in a state in which the linearity of the torsional rotation axis configured by a pair of the metal bars 4a is maintained with high accuracy. In addition, an assembling work can also be simplified.

Figure 5:
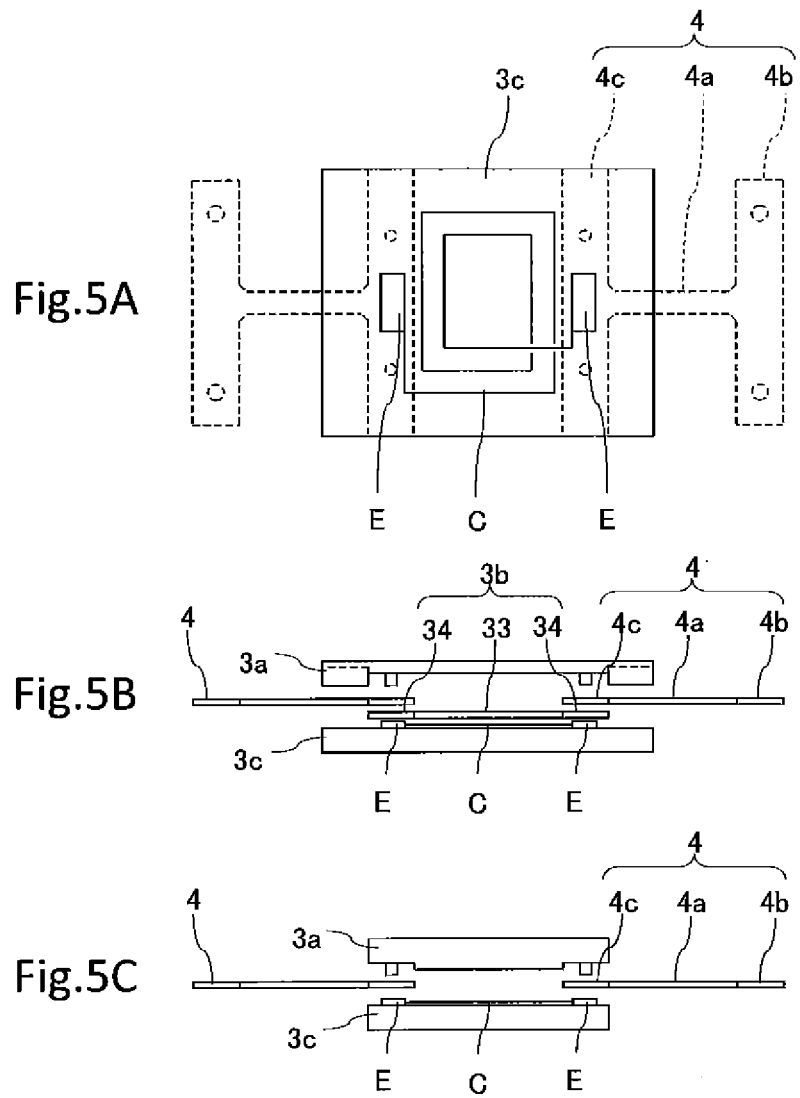
FIG. 5A is a plan view showing main parts of the movable unit (a coil substrate) and the metal elastic member.
FIG. 5B is a sectional view showing the main parts of the movable unit (the coil substrate) and the metal elastic member.
FIG. 5C is a sectional view showing main parts of a movable unit (the coil substrate) and a metal elastic member according to another embodiment.

FIGS. 5A and 5B show a state in which the electrode pads E formed on the coil substrate 3c and the movable unit pads 4c provided at the second end of the beams 4, 4 are positioned and disposed so as to be electrically in contact with each other through the spacer 3b. The spacer 3b has a central part formed by an insulating member 33 and both ends configured by a metal member 34. Each of the electrode pads E, E and each of the movable unit pads 4c, 4c are electrically connected to each other through metal members 34, 34. The structure will be described later in detail with reference to FIG. 7.

As shown in FIG. 3C, the positioning pin 2p provided on the fixed unit 2 is an electrode pin which is configured by a metal and serves to apply an alternating current to the coil C formed on the coil substrate 3c through the beams 4, 4.

Figure 6:
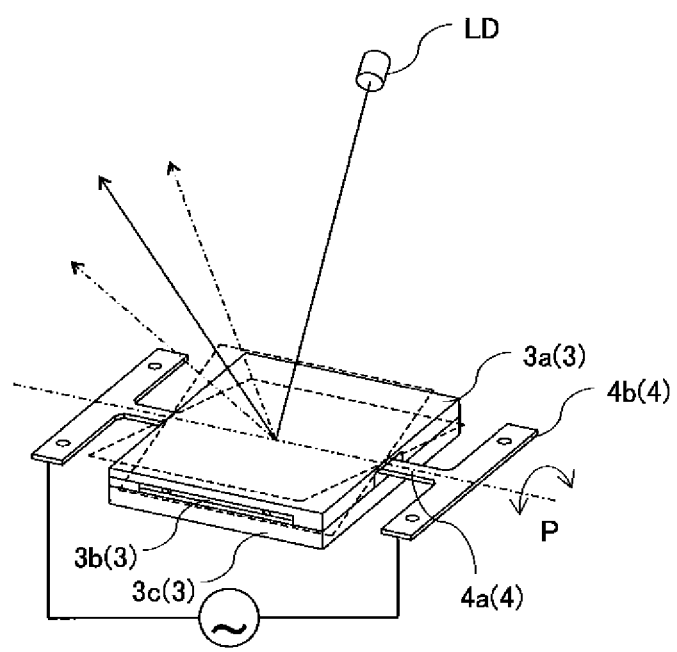
FIG. 6 is a view for explaining a swinging operation of the movable unit.

As shown in FIG. 6, when measurement light formed into parallel light through an optical lens (not shown) from a light emitting device LD such as a laser diode is incident on the deflecting mirror 3a and an alternating current is applied to the coil C, the deflecting mirror 3a is swung about the axis P with the beams 4, 4 serving as the torsional rotation axes, the incident light emitted from the light emitting device LD is deflected by the deflecting mirror 3a and reflected light is deflected and used to scan at an angle which is a double of a swing angle of the deflecting mirror 3a. For example, if the swing angle of the deflecting mirror 3a is set to be ±11.25°, the reflected light is used to scan within a scanning angle range of ±22.5°.

The beams 4, 4 are formed by a physical or chemical processing method excluding a mechanical processing method such as press working by using any of metals including a stainless material, a carbon tool steel material and a cold-reduced carbon steel sheet material which are rolled by a tension annealing method. The tension annealing method indicates treatment for leaving the stainless material or the like for a certain period of time in a nitrogen gas atmosphere containing a hydrogen gas at a high temperature while applying constant tensile stress thereto. For the physical or chemical processing method, there are suitably used a focused ion beam method, an etching method and a plating method (an electroforming method).

FIGS. 2A to 2E show a process for fabricating a metal elastic member constituting the beams 4, 4 by using the etching method according to an example of the chemical processing method. In the present example, a tension annealing material of SUS304CSP-H is used.

A photoresist 43 is uniformly applied onto a surface of a stainless thin plate 42 (see FIG. 2A) having a predetermined thickness (0.2 mm in the present embodiment) (see FIG. 2B) and light exposure is carried out through a photomask (not shown) formed in such a manner that regions corresponding to the metal bar 4a, the fixed unit pad 4b, the movable unit pad 4c, the frame 40 and the support unit 41 are shielded (see FIG. 2C).

When a photoresist 43b in the exposed region is removed with a predetermined etchant, a photoresist 43 layer is formed in only regions corresponding to the frame 40 and the beams 4 in the surface of the stainless thin plate 42 (see FIG. 2D).

Then, an etchant for dissolving stainless is sprayed onto the surface of the stainless thin plate 42 to gradually progress etching treatment. When the etching treatment is completed, the photoresist 43 is removed with a solvent. By the foregoing process, there can be formed a metal elastic member in which a pair of the metal bars 4a having the fixed unit pad 4b provided at the first end and the movable unit pad 4c provided at the second end are disposed symmetrically on a straight line in the frame 40, and the respective pads 4b and 4c are formed integrally so as to be fixed to the frame 40 through the support unit 41 (see FIG. 2E).

In the case where the metal elastic member is fabricated by using the plating method, there is created a mold frame having a predetermined depth in which the photoresist 43 shown in FIG. 2D takes a shape of a concave portion, a mold release agent is applied onto the mold frame and an electrolytic solution containing a metal ion is then filled therein to electrodeposit a metal in the electrolytic solution. Thus, the metal elastic member can be fabricated.

When the metal bar 4a constituting the beam 4 is formed by a mechanical processing (plastic processing) method such as press working or cut working, concentration of a stress is caused by stress amplitude in a plurality of very small scratches formed on the surface in the processing and a crack is thus grown with the very small scratches set as starting points. Consequently, a fatigue strength is reduced. Therefore, the movable unit 3 cannot be swung stably for a long period of time.

If the metal bar 4a serving as the beam is formed by using the physical or chemical processing method excluding the mechanical processing method, however, there is a very low probability that such a scratch as to grow a crack might be formed on the surface due to the stress amplitude. Accordingly, there is a very small fear that the fatigue strength might be reduced.

In general, various properties of a metallic material, for example, a yield strength and the like are measured based on a specimen having a diameter of 10 mm (a sectional area of 78.5 mm$^2$) However, a yield strength of a specimen fabricated in at least a dimension of one digit or less (a diameter of 1 mm (a sectional area of 0.785 mm$^2$) or less) of the specimen tends to have a greater value than a published value, and it can be assumed that the sectional area is set to be very small and an effective yield strength thus has a greater value by several tens %.

The following is qualitatively understood. If an existence probability of a scratch on a surface of a target is constant, the absolute number of scratches to be base points of cracks of a Very High Cycle Fatigue is decreased with reduction in a surface area which is caused by decrease in a size. If a defect probability in an inner part of the target is equal, alternatively, the absolute number of internal defects to be the base points of the cracks of the Very High Cycle Fatigue is decreased with reduction in a volume. As a result, durability or a yield strength is increased.

Although there is a limit, it can be supposed that a smaller substance approximates to an original physical property value of the substance more greatly. The present inventor has confirmed, by an experiment, that a fatigue limit in a torsion direction obtained by a specimen having a diameter of 10 mm has a mechanical angle of ±9.25°, while a metal beam having a section of 0.2 mm×0.25 mm with the use of the same metallic material has a mechanical angle of ±15.5°.

In consideration of the experiential knowledge of the skilled in the art that a maximum stress of a torsional portion is approximately 1.4 times as high as an ordinary stress and a strength is increased by approximately 20% if a sectional dimension is reduced by one digit, a fatigue limit is increased to be approximately 1.2×1.2=1.4 times as high as an ordinary fatigue limit because of a size effect which is smaller by two digits. The increase in the durability and the yield strength is supported by a result obtained through the execution of an experiment from the general qualitative understanding to quantitative understanding.

By molding the metal bar to have a sectional area of 1 mm$^2$ or less, therefore, it is possible to correspondingly constitute a beam exhibiting an excellent effective yield strength. Consequently, the movable unit 3 can be swung stably for a long period of time within a frequency of 150 Hz to 500 Hz. A swing angle of the deflecting mirror 3$a$ constituting the movable unit 3 is not limited to be ±11.25° but has a value set properly depending on the intended use of the miniature machine 1.

It is sufficient that the metal bar 4$a$ constituting the beams 4, 4 shown in FIG. 2E is formed to have a sectional area of 1 mm$^2$ or less, and it is preferable that the metal bar 4$a$ should be molded within a range of 0.001 mm$^2$ to 1 mm$^2$.

In the present embodiment, the metal bar 4$a$ is formed to have a width of 1.0 mm, a thickness of 0.2 mm, a length of 5 mm and a sectional area of 0.20 mm$^2$. Each unit of the miniature machine 1 has a size as follows. The fixed unit 2 is formed to have a width of 23 mm, a depth of 26 mm and a thickness of 5.5 mm, and the movable unit 3 is formed to have a width of 12.0 mm, a depth of 12.0 mm and a thickness of 2.0 mm.

Figure 11A:
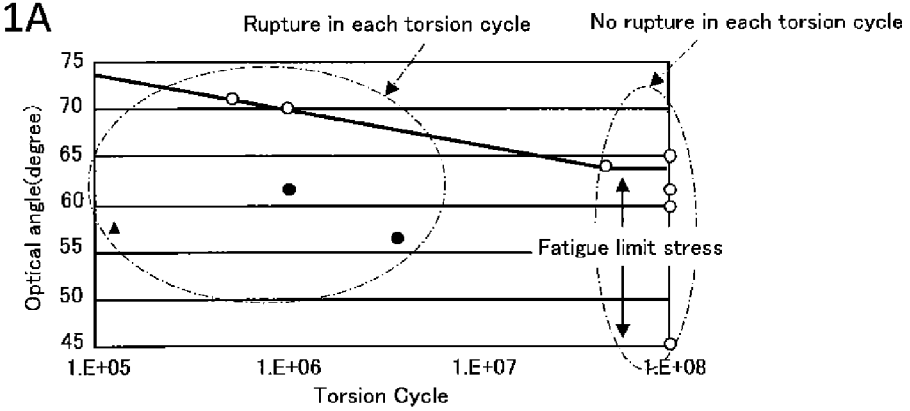
FIG. 11A is an S-N chart showing a result of a rupture test.

FIG. 11A is an S-N chart showing a result of a rupture test in the case where the beam 4 having a sectional area of 0.05 mm$^2$ and a length of 4 mm is used to swing the deflecting mirror 3$a$ having an area of 144 mm$^2$ (12 mm×12 mm) at a driving frequency of 200 Hz (an average resonance frequency: 188.6 Hz).

A white circle indicates a characteristic of a beam configured by the SUS304CSP-H tension annealing material and a black circle indicates a characteristic of a beam configured by the SUS304CSP-H stress release material, and a black triangle indicates a characteristic of a beam configured by a CoNi alloy material subjected to aging treatment (a material which is well-known to have high durability). An optical angle of an axis of ordinates indicates a total swing angle of measurement light. For example, in the case of an optical angle of 60°, the swing angle of the measurement light is ±30° and a swing angle of a deflection plate is ±15°.

As a result of the test, the black circle and the black triangle reach a rupture. On the other hand, although the rupture is reached at an optical angle of 70° or more in the case of the white circle (the tension annealing material), there is no sample reaching the rupture even if 100 million times of a swing cycle are exceeded in the case of an optical angle of 65° or less. As shown in the white circle and the black circle at an optical angle of 62°, it is apparent that a rupture cycle is changed by two digits or more depending on the presence of tension anneal even if suitable stainless SUS304CSP-H is used as a spring material.

Figure 11B:
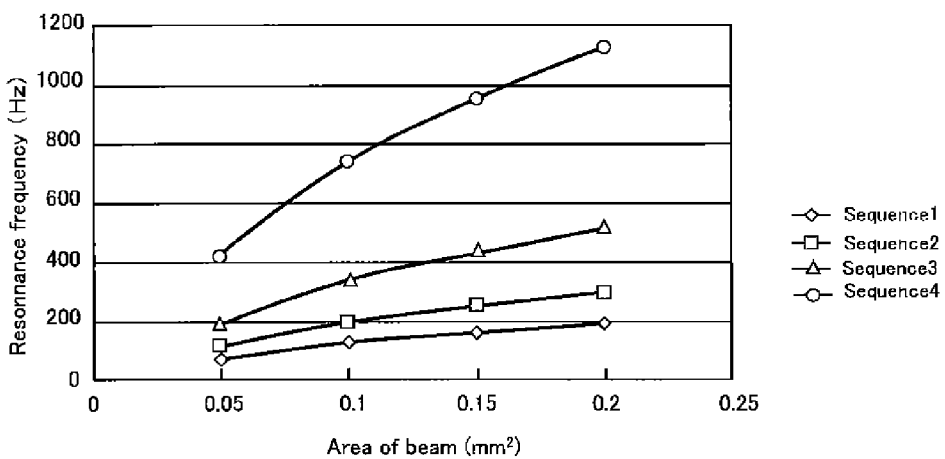
FIGS. 11B and 11C are characteristic charts showing a simulation result, illustrating a relationship between a sectional area of a beam and a resonance frequency.
Figure 11C:
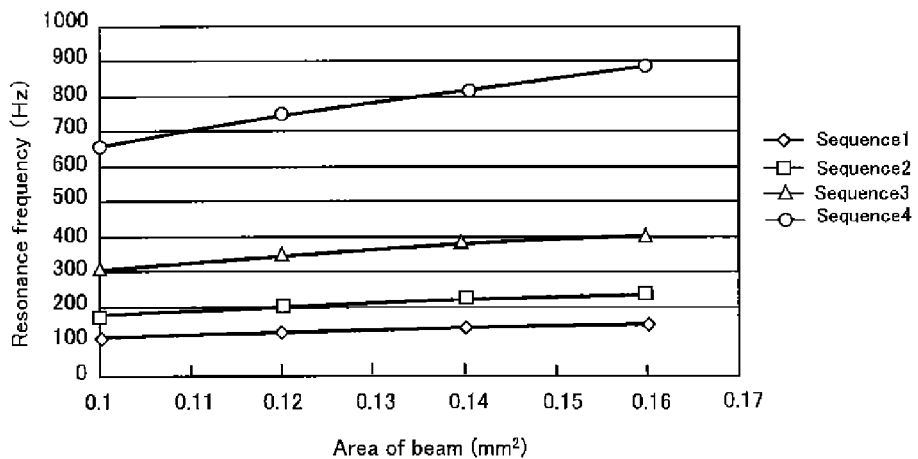

FIGS. 11B and 11C show a result of a simulation for a resonance frequency in the case where the area of the deflecting mirror 3$a$, the sectional area of the beam and the length of the beam are varied. A simulation parameter is subjected to fitting by a movable mirror produced by way of trial (a condition 1 an area of 12 mm×12 mm, a sectional area of a beam of 0.05 mm$^2$, a beam length of 4 mm and an average measured resonance frequency of 188.6 Hz, and a condition 2=an area of 12 mm×12 mm, a sectional area of a beam of 0.16 mm$^2$, a beam length of 5 mm and an average measured resonance frequency of 400.7 Hz), and a simulation on the other condition is thus executed. It is confirmed that swinging can be carried out with a variation in the resonance frequency from 50 Hz to 1 KHz or more by a change in the shapes of the deflecting mirror and the beam.

FIG. 11B shows a simulation result based on the condition 1, that is, a variation in the resonance frequency in the case where the length of the beam is fixed to be 4 mm and the sectional area of the beam is changed. In FIG. 11B, a sequence 1 is a deflecting mirror of 20 mm×20 mm, a sequence 2 is a deflecting mirror of 16 mm×16 mm, a sequence 3 is a deflecting mirror of 12 mm×12 mm, and a sequence 4 is a movable mirror of 8 mm×8 mm.

FIG. 11C shows a simulation result based on the condition 2, that is, a variation in the resonance frequency in the case where the length of the beam is fixed to be 5 mm and the sectional area of the beam is changed. In FIG. 11C, a sequence 1 is a deflecting mirror of 20 mm×20 mm, a sequence 2 is a deflecting mirror of 16 mm×16 mm, a sequence 3 is a deflecting mirror of 12 mm×12 mm, and a sequence 4 is a movable mirror of 8 mm×8 mm.

Figure 7:
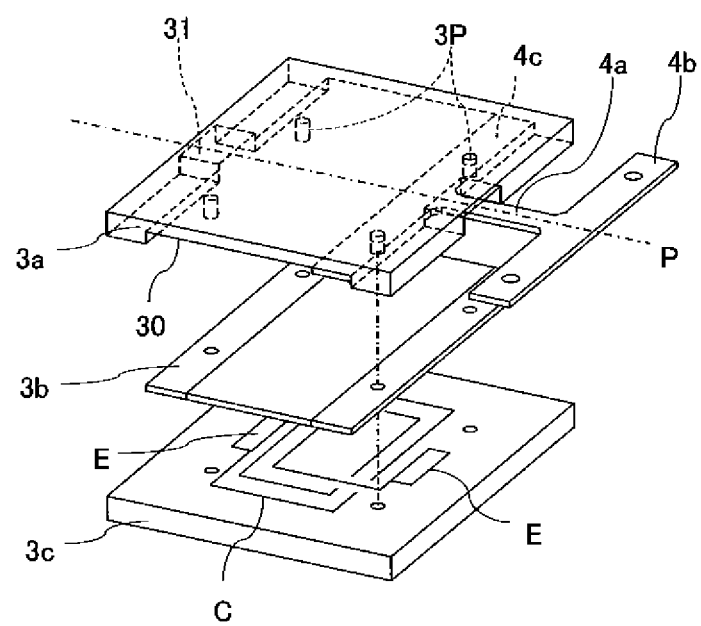
FIG. 7 is a view for explaining a site in which the metal elastic member is attached to the fixed unit.

FIG. 7 shows a positional relationship between the metal elastic member having the fixed unit pad 4$b$ and the movable unit pad 4$c$ formed on the respective ends of the metal bar 4$a$, and the glass substrate 3$a$ to be an upper substrate and the glass epoxy substrate 3$c$ to be a lower substrate (for example, the deflecting mirror and the coil substrate) and the spacer 3$b$ to be a glass epoxy substrate which constitute the movable unit 3.

At a bottom face of the upper glass substrate 3$a$, a first groove portion 30 is formed in an orthogonal direction to the axis P, and furthermore, paired second groove portions 31, 31 are formed in a direction along the axis P. A depth of the first groove portion 30 is slightly greater than the thickness of the movable unit pad 4$c$, and a depth of each of the second groove portions 31, 31 is further greater than that of the first groove portion 30.

In a state in which paired positioning pins 3P formed on the first groove portion 30 is inserted into the positioning hole portion of the movable unit pad 4$c$, the spacer 3$b$ is inserted into the first groove portion 30 and is thus bonded so as to have the movable unit pad 4$c$ sandwiched between the bottom face of the first groove portion 30 and the upper surface of the spacer 3$b$. Furthermore, paired positioning pins 3P are positioned to be inserted into paired positioning hole portions formed on the glass epoxy substrate provided below so that the upper glass substrate and lower glass epoxy substrate are bonded to each other.

A metal member is provided to electrically connect both the electrode pads E formed on the coil substrate 3c and the movable unit pads 4c of the metal elastic member at both ends in the spacer 3b where the electrode pads E and the movable unit pads 4c are opposed to each other. The spacer 3b is configured by disposing an insulating member between paired metal members.

When the first groove portion 30 and the second groove portions 31, 31 are thus formed on the upper glass substrate 3a, the metal bar 4a holds its posture in a state in which it does not come in contact with the upper glass substrate 3a and lower glass epoxy substrate 3c. Consequently, it is possible to eliminate a drawback that the metal bar 4a comes in contact with the glass substrate 3a and the glass epoxy substrate 3c in a torsional operation thereof.

In addition, also in the case where the upper glass substrate 3a is caused to serve as a deflecting mirror and an area of a deflection surface is to be increased, it is not necessary to reduce the length of the metal bar 4a by employing the structure.

The connecting mode of the beam 4 and the movable unit 3 described with reference to FIGS. 5A, 5B and 7 is only illustrative and the connecting mode of the beam 4 and the movable unit 3 according to the present invention is not restricted to the structure.

For example, in the case where the movable unit pads 4c are fixed to the vicinity of edge portions of the upper glass substrate 3a and lower glass epoxy substrate 3c and the metal bar 4a is disposed so as not to be covered with the upper glass substrate 3a and lower glass epoxy substrate 3c as shown in FIG. 5C, it is sufficient that a concave portion for accommodating the movable unit pad 4c is formed on the edge portion of the upper glass substrate 3a and a spacer does not need to be provided.

Figure 8:
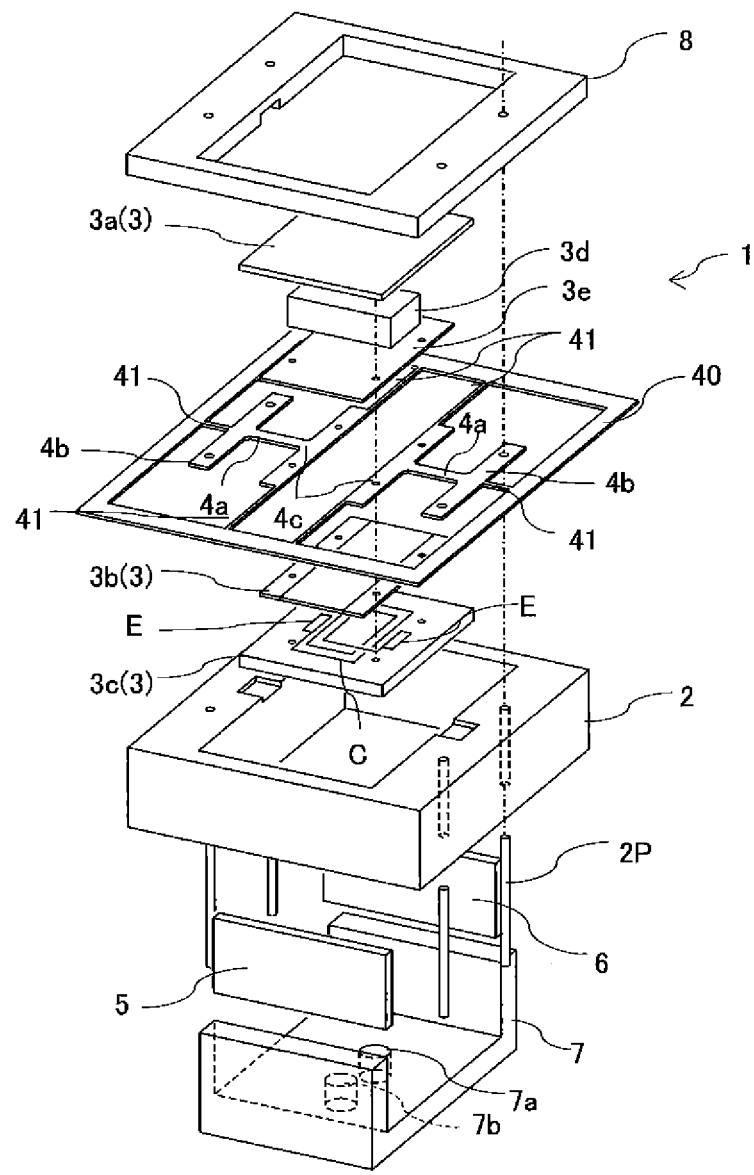
FIG. 8 is an exploded perspective view showing a miniature machine according to another embodiment.
Figure 9:
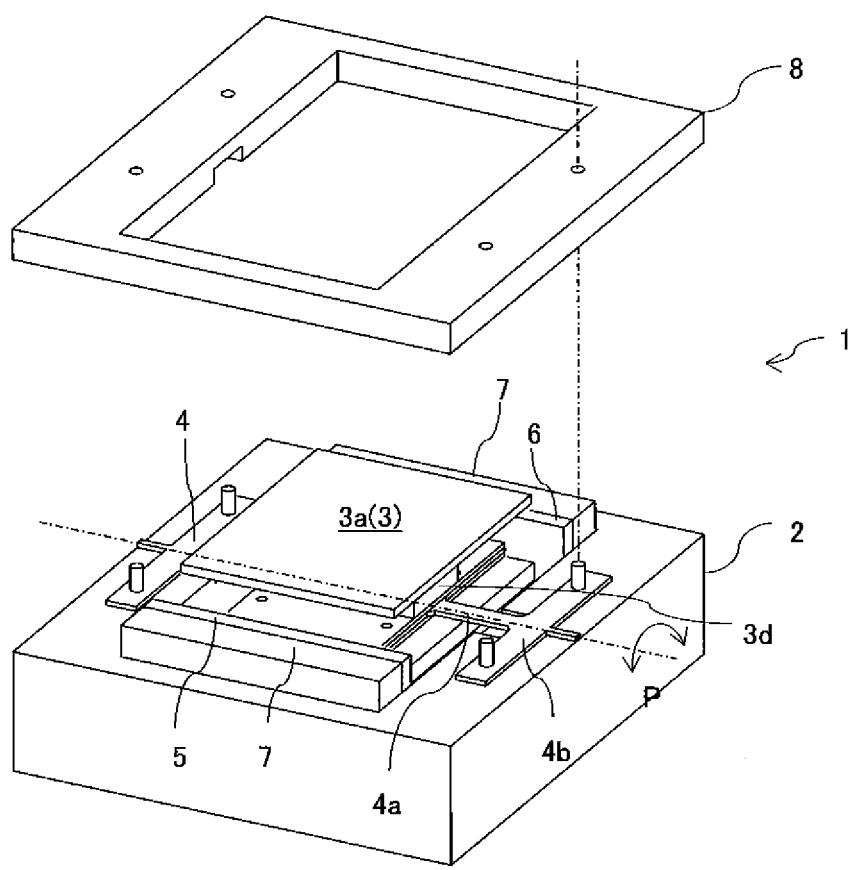
FIG. 9 is a perspective view showing the miniature machine according to another embodiment.

As shown in FIGS. 8 and 9, moreover, spacer members 3d and 3e formed of polycarbonate may be inserted between the deflecting mirror 3a and the movable unit pad 4c, for example, in such a manner that the deflection surface of the deflecting mirror 3a is higher than the permanent magnets 5 and 6. If the deflection surface of the deflecting mirror 3a is thus raised, there is no fear that measurement light to be deflected by the deflecting mirror 3a might be shielded by rising portions of the permanent magnets 5 and 6 in a swinging movement of the deflecting mirror 3a.

Figure 10:
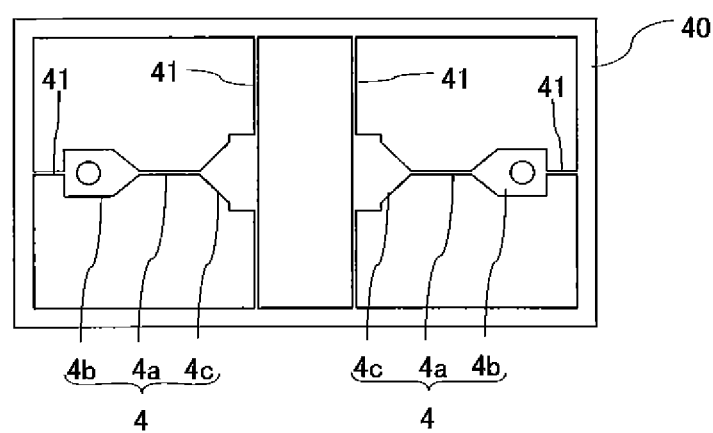
FIG. 10 is a view for explaining a metal elastic member according to another embodiment.

FIG. 10 shows a metal elastic member taking a different shape from the metal elastic member described above. The metal bar 4a is formed to have a width of 0.1 mm, a thickness of 0.05 mm, a length of 1.50 mm and a sectional area of 0.005 $mm^2$.

It is sufficient that the metal bar 4a constituting the metal elastic member according to the present invention is formed to have a sectional area of 1 $mm^2$ or less, and the width, the thickness and the length can be set properly. Moreover, the shapes of the fixed unit pad 4b and the movable unit pad 4c are not particularly restricted but are preferably adapted to a miniature machine into which they are to be incorporated.

The intended use of the miniature machine according to the present invention is not restricted to a scanning type distance measuring device but can be applied to a device requiring to scan with light, for example, a projector. For instance, it is possible to implement the projector by assembling a light emitting device to the upper glass substrate 3a constituting the movable unit 3 and controlling a light emitting state of the light emitting device while swinging the miniature machine in an orthogonal direction to a scanning direction depending on a scanning angle.

Although the description has been given of the miniature machine 1 including the single movable unit 3 supported by paired beams 4, 4 in the embodiment, it is also possible to employ a structure in which the single miniature machine 1 is provided with the single movable unit 3 supported by paired beams 4, 4 in plural sets.

In the embodiment, there has been described the example of the metal elastic member, the miniature machine and the method of manufacturing the miniature machine according to the present invention. The technical scope of the present invention is not restricted to the description but it is apparent that the specific structures, sizes and the like of the respective units can be properly changed and designed within a range in which functions and effects according to the present invention can be produced.

Next, description will be given of a swing control device and a swing control method which serve to swing and drive the movable unit of the miniature machine. An application target of the swing control device and the swing control method according to the present invention is not restricted to the miniature machine according to the present invention but can be widely applied to the conventional miniature machines described in Japanese Unexamined Patent Publication Nos. 2003-84226, 9-281417, 2009-175368, and 2008-40228.

As described with reference to FIGS. 1, 4 and 5A, the miniature machine to be controlled by the swing control device has a structure in which the coil C is formed in the movable unit 3 supported by the fixed unit 2 through paired beams 4, 4, and furthermore, magnetic field forming units 5, 6 and 7 are provided in the fixed unit 2 to swing the movable unit 3 by electromagnetic force generated by a current flowing to the coil C and magnetic fields formed by the magnetic field forming units 5, 6 and 7.

Figure 12:
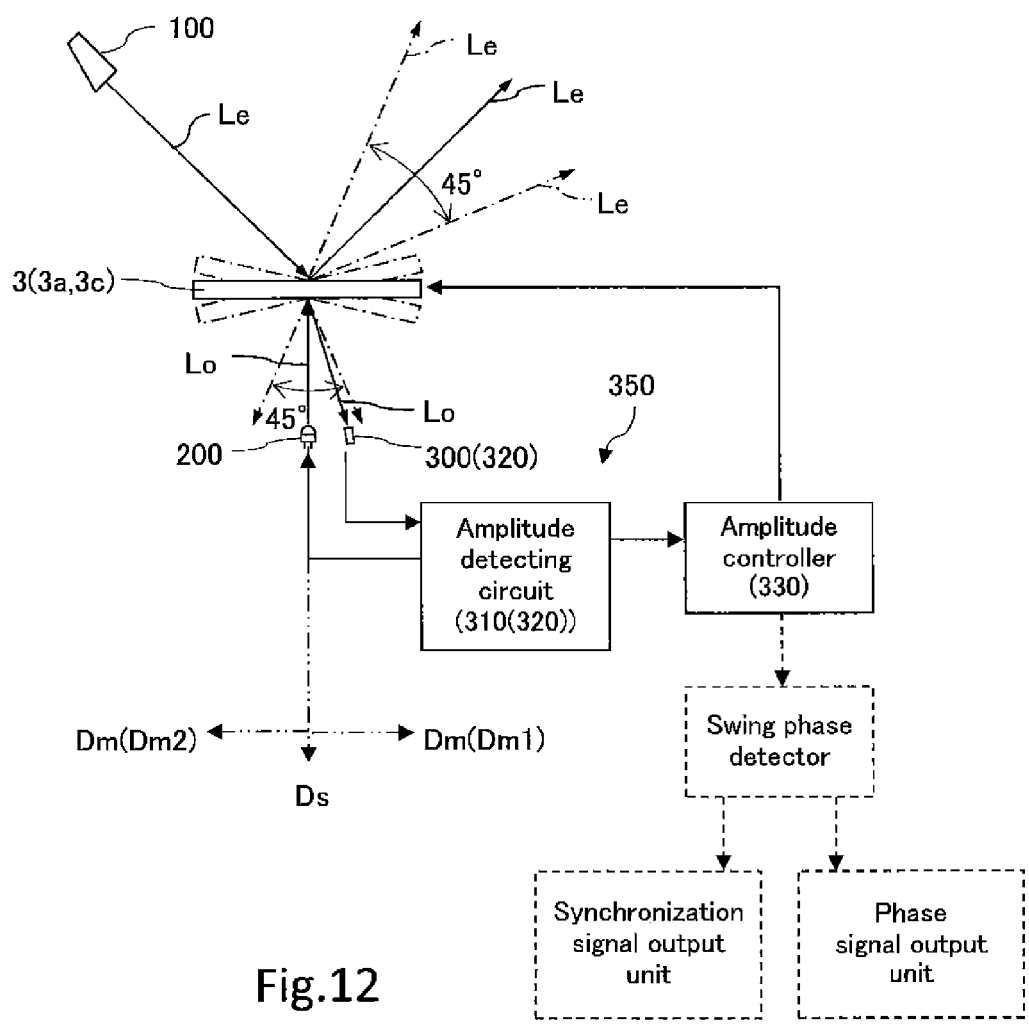
FIG. 12 is a diagram for explaining a swing control device for controlling swing of a movable unit.

FIG. 12 shows the movable unit 3 incorporated into the miniature machine configured as a distance measuring device. A first light deflecting surface is formed on the surface of the movable unit 3. The first light deflecting surface serves to deflect measurement light irradiated along an optical path Le from a measurement light source provided in a light receiving and emitting portion 100 and scan a measurement space with the light and to deflect reflected light of the measurement light toward a light receiving portion for measurement provided in the light receiving and emitting portion 100.

A second light deflecting surface with gold or aluminum deposited thereonto is also formed on the back face of the movable unit 3, that is, the back face of the coil substrate 3c. A monitor light irradiated from a monitor light source 200 disposed on the back face side of the movable unit 3 is guided to the second light deflecting surface along an optical path Lo and reflected light thereof is detected by a light receiving portion 300 for monitoring which is disposed on the back face side of the movable unit 3 in the same manner.

In the case where the monitor light source and the measurement light are used concurrently and the measurement light is thus detected by the light receiving portion for monitoring, it is necessary to install the light receiving portion for monitoring within a scanning range for the measurement light deflected and reflected by the first light deflecting surface and the measurement light deflected and reflected is shielded by the light receiving portion for monitoring so that a measuring range is limited. When amplitude of the movable unit is increased to ensure a predetermined measuring range, therefore, there is caused a problem in that a distortion of the beam is increased and a life is thus shortened.

When the second light deflecting surface for monitoring is formed on the back face of the movable unit 3, however, it is possible to accurately detect the amplitude without inhibiting an original function of the movable unit which deflects the measurement light and scans the measurement space with the light. Therefore, it is also possible to require the amplitude of the movable unit at a minimum, thereby preventing the life of the beam from being shortened.

The light receiving and emitting portion 100 and the monitor light source 200 are positioned with respect to the movable unit 3 in such a manner that measurement light sent from the light receiving and emitting portion 100 is incident on the first light deflecting surface of the movable unit 3 in a stationary state at an incident angle of 45° and a monitor light sent from the monitor light source 200 is incident on the second light deflecting surface of the movable unit 3 at an incident angle of 0°.

A laser diode or an LED is suitably used as the monitor light source 200, and a photodiode or a phototransistor is used as the light receiving portion 300 for monitoring. For example, if the swing angle of the movable unit 3 is ±11.25°, the scanning angle range for the measurement light and the monitor light is ±22.5°, that is, 45°.

The monitor light source 200 and the light receiving portion 300 for monitoring may be incorporated into the miniature machine or may be incorporated into an external case positioned with respect to the miniature machine.

As shown in FIG. 4, an opening portion 7a for guiding the monitor light to the second deflection surface and an opening portion 7b for guiding the reflected light to the light receiving portion 300 for monitoring are formed on a bottom portion of the magnetic retainer 7.

As shown in FIG. 12, a swing control device 350 includes an amplitude detector 320 having the light receiving portion 300 for monitoring and an amplitude detecting circuit 310, and an amplitude controller 330.

The light receiving portion 300 for monitoring detects a monitor light guided from the movable unit 3, that is, a monitor light along the optical path Lo having an angle varied with the swinging movement of the movable unit 3 in an inclined direction to a swinging direction Dm with respect to a swinging center direction Ds of the movable unit 3.

The amplitude detecting circuit 310 detects two sections including a long cycle section and a short cycle section which constitutes one swing cycle of the movable unit 3 based on the monitor light detected by the light receiving portion 300 for monitoring.

The amplitude controller 330 variably controls a frequency while maintaining a current value of a current to be applied to the coil C in such a manner that a time ratio of the long cycle section and the short cycle section which are detected by the amplitude detector 320 has a target value.

A detection cycle of the monitor light to be detected by the light receiving portion 300 for monitoring is equal to the swing cycle of the movable unit 3. In the case where the movable unit 3 is swung from the swinging center direction to a first swinging direction Dm1 on the side of the light receiving portion 300 for monitoring, the monitor light is detected by the light receiving portion 300 for monitoring in a going movement in which the movable unit 3 is swung toward a maximum swing angle and a return movement in which the movable unit 3 is swung toward a maximum swing angle at an opposite side, and the movable unit 3 is then swung from the swinging center direction Ds to a second swinging direction Dm2 at an opposite side to the light receiving portion 300 for monitoring and the monitor light is detected by the light receiving portion 300 for monitoring in the return movement from the maximum swing angle at the opposite side.

The amplitude detector 320 detects, as the short cycle section, a detection interval of the monitor light to be detected in the case of the swinging movement from the first swinging direction Dm1 to the second swinging direction Dm2, detects, as the long cycle section, a detection interval of the monitor light to be detected in the case of the swinging movement from the second swinging direction to the first swinging direction, and detects a total time including the short cycle section and the long cycle section as a one cycle of the movable unit 3.

Specifically, the amplitude detector 320 includes a comparator for binarizing a monitor light with a predetermined threshold, a timer circuit for triggering a signal edge detected by the comparator, thereby counting each of times for a short cycle section and a long cycle section, a storage portion for storing a value of the timer circuit, and the like.

Figure 13:
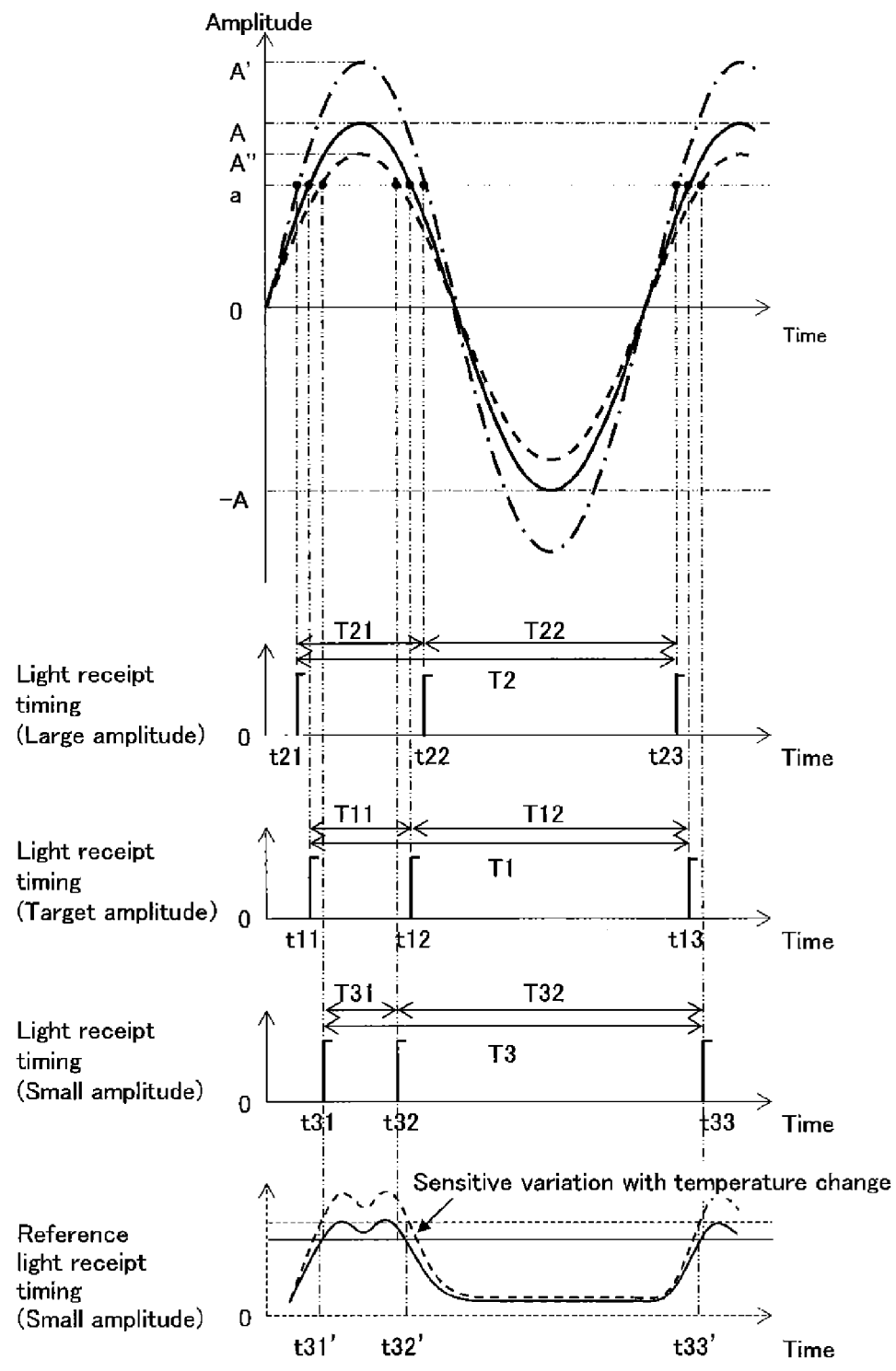
FIG. 13 is a chart for explaining a state in which swing amplitude of the movable unit fluctuates.

In an upper part of FIG. 13, there are shown an amplitude characteristic curve (a solid line) in the case where the movable unit 3 has target amplitude A (at this time, a swing angle is +11.25°), an amplitude characteristic curve (a broken line) in the case where the movable unit 3 has amplitude A' larger than the target amplitude A (at this time, the swing angle is greater than +11.25°), and an amplitude characteristic curve (a dashed line) in the case where the movable unit 3 has amplitude A" smaller than the target amplitude A (at this time, the swing angle is smaller than +11.25°), and furthermore, there is shown swing amplitude "a" in which the monitor light is reflected toward the light receiving portion 300 for monitoring.

In a lower part of FIG. 13, there is shown timing for detecting the monitor light by the light receiving portion 300 for monitoring. Ideally, it is preferable that the movable unit 3 should be swung continuously at the target amplitude A. When the resonance frequencies of the beams 4, 4 including the movable unit 3 are changed due to a fluctuation in an environmental temperature or the like, however, the amplitude is shifted from the target amplitude A. The amplitude of the movable unit 3 is increased when the resonance frequency approximates to the frequency of the current to be applied to the coil C, and the amplitude of the movable unit 3 is reduced when the resonance frequency keeps away from the frequency of the current to be applied to the coil C.

When the movable unit 3 has the target amplitude A, the amplitude detector 320 detects a short cycle section T11 and a long cycle section T12 and detects a total time T1 of the short cycle section T11 and the long cycle section T12 as one cycle of the movable unit 3.

When the movable unit 3 has the amplitude A' which is greater than the target amplitude A, the amplitude detector 320 detects a short cycle section T21 and a long cycle section T22 and detects a total time T2 (=T1) of the short cycle section T21 and the long cycle section T22 as one cycle of the movable unit 3.

When the movable unit 3 has the amplitude A" which is smaller than the target amplitude A, similarly, the amplitude detector 320 detects a short cycle section T31 and a long cycle section T32 and detects a total time T3 (=T1) of the short cycle section T31 and the long cycle section T32 as one cycle of the movable unit 3.

If the time ratio of the long cycle section and the short cycle section which are detected by the amplitude detector 320 is shifted from a target value (T11/T12), the amplitude controller 330 variably controls a frequency f while constantly maintaining the current value of the current to be applied to the coil C in such a manner that the time ratio has the target value (T11/T12).

As a result, the amplitude of the movable unit 3 is constantly maintained to be the target amplitude A. Specifically, the amplitude controller 330 includes an arithmetic circuit for calculating a deviation between the time ratio of the long cycle section and the short cycle section and the target value of the time ratio, a feedback calculating portion illustrated as a PID calculation, or the like for calculating a control value of a frequency of an applied current based on the deviation, an AC power supply circuit, and the like having a PLL circuit for regulating the frequency of the applied current correspondingly to the control value calculated by the feedback calculating portion. To constantly maintain the current value of the current to be applied to the coil C implies that an effective value of an alternating current is maintained to be constant.

Figure 14A:
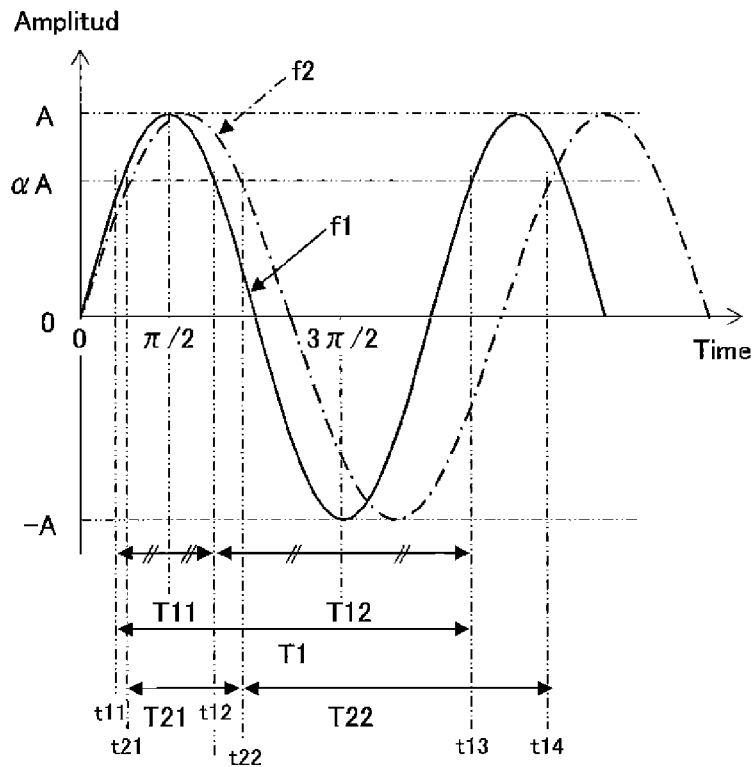
FIG. 14A is a chart for explaining the principle of the swing control.

As shown in FIG. 14A, there is assumed the case where the amplitude detector 320 detects a monitor light at a position of amplitude αA, for each of the movable units 3 having the same swing amplitude A and swing frequencies f1 and f2 (f1<f2), respectively.

The movable unit 3 having the swing frequency f1 is swung in $A1(t)=A \sin 2\pi f1 t$ and the movable unit 3 having the swing frequency f2 is swung in $A2(t)=A \sin 2\pi f2 t$. Times t11, t12 and t13 in which the amplitude reaches αA are found in the following equations.

$$t11=\{1/(2\pi f1)\} \times \sin^{-1}(\alpha)$$

$$t12=\{1/(2\pi f1)\} \times \{\pi \times \sin^{-}(\alpha)\}$$

$$t13=\{1/(2\pi f1)\} \times \{2\pi \times \sin^{-1}(\alpha)\}$$

are found from $$\alpha A = A \sin 2\pi f1 t$$

$$\alpha A = A \sin 2\pi f2 t$$

wherein $0 \leq \sin^{-1}(\alpha) \leq \pi/2$ is set.

Accordingly, $$T11=t12-t11=\{1/(2\pi f1)\} \times \{\pi-2 \sin^{-1}(\alpha)\}$$

$$T12=t13-t12=\{1/(2\pi f1)\} \times \{\pi+2 \sin^{-1}(\alpha)\}$$

$$T11/T12=\{\pi-2 \sin^{-1}(\alpha)\}/\{\pi+2 \sin^{-1}(\alpha)\}$$

are obtained, and similarly $$T21/T22=\{\pi-2 \sin^{-1}(\alpha)\}/\{\pi+2 \sin^{-1}(\alpha)\}$$

is obtained.

In other words, if the amplitude is equal, T1/T2 (=T11/T12=T21/T22) is constant even though the frequency is varied. To the contrary, if the frequency is regulated in such a manner that T1/T2 is constant, the amplitude is maintained to be constant.

Figure 14B:
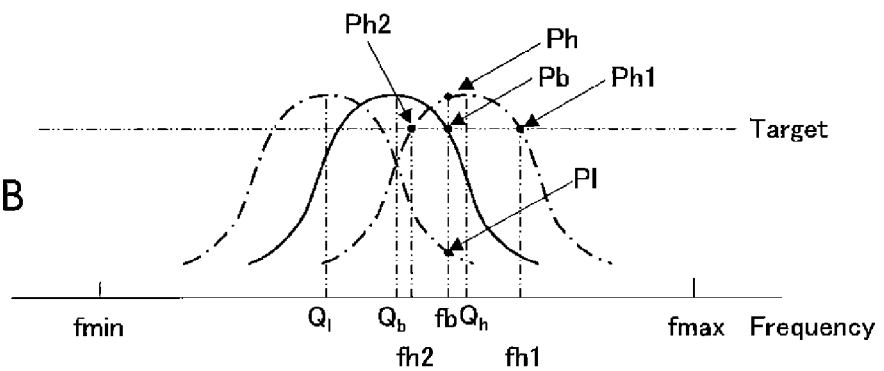
FIG. 14B is a chart for explaining frequency control on an applied current with respect to a fluctuation in the resonance frequency.

As shown in FIG. 14B, in the case where an original resonance frequency of the beams 4, 4 including the movable unit 3 is represented by Qb, the amplitude controller 330 constantly maintains the current to be applied to the coil C in an early stage, and at the same time, a frequency of the current is changed continuously or gradually from a frequency fmax which is sufficiently higher than the resonance frequency Qb to a frequency fmin which is sufficiently lower than the resonance frequency Qb.

The amplitude controller 330 decides, at each time, whether the time ratio of the long cycle section and the short cycle section which are detected by the amplitude detector 320 has the target value or not, and maintains the frequency (a frequency indicated as fb in FIG. 14B) if the time ratio converges on a predetermined tolerance. In FIG. 14B, an operating point of the movable unit 3 is indicated as a Pb point of a resonance characteristic of the resonance frequency Qb.

Then, the operating point is changed to a P1 point of a resonance characteristic of a resonance frequency Q1 so that the amplitude is decreased when the resonance frequency is reduced to Q1, and the operating point is changed to a Ph point of a resonance characteristic of a resonance frequency Qh so that the amplitude is increased when the resonance frequency is increased to Qh.

For example, in the case where the resonance frequency is increased to Qh, the amplitude controller 330 regulates the frequency of the current to be applied to the coil C into fh1 which is higher than the resonance frequency Qh or fh2 which is lower than the resonance frequency Qh in such a manner that the time ratio of the long cycle section and the short cycle section has the target value.

As a result, the movable unit 3 is operated on a Ph1 point or a Ph2 point of the resonance characteristic of the resonance frequency Qh. In the case where the stability of the operation exhibits a difference on the Ph1 point or the Ph2 point, it is preferable to carry out the regulation into either of the operating points which has the higher stability of the operation.

In actual trial fabrication, a high frequency side of a resonance point has the higher stability. For this reason, scanning is always carried out from the frequency fmax side to set the operating point. In this case, accordingly, it is possible to maintain the amplitude to have the target value by raising the frequency with increase in the amplitude and reducing the frequency with decrease in the amplitude. In the case of FIG. 14B, the operating point is moved to the Ph1 point.

In other words, the swing control method according to the present invention serves to detect a monitor light guided from the movable unit 3, that is, a monitor light along the optical path having an angle varied with the swinging movement of the movable unit 3 in an inclined direction to the swinging direction Dm with respect to the swinging center direction Ds of the movable unit 3, to detect two sections including the long cycle section T12 and the short cycle section T11 which constitute one swing cycle of the movable unit 3 based on the monitor light thus detected, and to variably control a frequency while maintaining the current value of the current to be applied to the coil C in such a manner that the time ratio T11/T12 (or T12/T11) of the long cycle section T12 and the short cycle section T11 which are detected has a target value.

Each "light receipt timing" shown in FIG. 13 has been described by taking, as an example, a waveform obtained by using a laser diode for a monitor light source, binarizing a signal of the monitor light detected by the light receiving portion 300 for monitoring through the comparator and detecting a rising edge as each light receipt timing by the amplitude detector 320.

As with an analog signal waveform shown by a solid line of a "reference light receipt timing" in FIG. 13, however, in some cases in which a light source having a comparatively great light beam such as an LED is used for the monitor light source, a signal waveform corresponding to the monitor light detected by the light receiving portion 300 for monitoring becomes blunt so that rising edges corresponding to t31 and t32 cannot be detected in the short cycle section, for example.

In this case, a threshold for binarization is decreased so that a rising edge t31' and a falling edge t32' in the short cycle section can be substituted for values corresponding to t31 and t32.

In the case of an analog signal, a luminous efficiency or a light reception sensitivity is varied with a change in a temperature. For this reason, an electrical light receiving signal level is changed as shown a broken line of the "reference light receipt timing" in FIG. 13. It is possible to prevent the influence of a temperature change by properly varying a ratio of a short cycle period and a long cycle period depending on a temperature or changing a threshold for binarization in the case where control is carried out in the analog signal waveform.

Another preferred embodiment of the swing control device 350 will be described below.

It is preferable to include a swing phase detector for detecting a swing phase φ of the movable unit 3 and a synchronization signal output unit for regulating a measurement time through measurement light in synchronization with the swing phase φ detected by the swing phase detector.

The distance measuring device includes a distance measurement calculating portion for calculating a distance to a reflecting position (an object) of measurement light based on a phase difference or a time difference from reflected light detected subsequently on the basis of an emission time of measurement light from the measurement light source provided in the light receiving and emitting portion 100. For example, the distance measurement calculating portion employing a TOF method carries out lighting control over the measurement light source in a predetermined cycle to calculate a distance to the object, and specifies coordinates of the object from the distance at that time and an emitting direction of the measurement light.

If the cycle of the movable unit 3 and the emission time of the measurement light are shifted from each other, however, it is impossible to accurately obtain the coordinates of the object by the distance measurement calculating portion. In other words, there is the following fear. Specifically, a measuring direction is varied if the swing cycle of the movable unit is changed in order to control the amplitude of the movable unit to be constant in a state in which a measuring cycle (a lighting cycle) utilizing measurement light is maintained to be constant. Consequently, it is impossible to obtain a measured value corresponding to a measuring direction which is originally necessary. Moreover, there is also a fear that the number of necessary measured values in the swing cycle might be increased/decreased.

Also in that case, the distance measurement calculating portion can regulate a measurement time through measurement light based on a synchronization signal synchronized with a swing phase which is output from a synchronization signal output unit. Even if the swing cycle of the movable unit is varied, it is possible to reliably obtain the measured value corresponding to the measuring direction which is originally necessary.

As shown in FIG. 14A, for example, the amplitude is maximized at a time for a half of each of the long cycle section T12 and the short cycle section T11 which are detected by the amplitude detector 320. The swing phase detector can detect a time for the half of each of the sections by counting a time since starting stages of the long cycle section T12 and/or the short cycle section T11 which are/is detected by the amplitude detector 320.

In other words, the time for the half of the short cycle section T11 can be detected as a time that a phase $\pi/2$ is obtained, and furthermore, the time for the half of the long cycle section T12 can be detected as a time that a phase $3\pi/2$ is obtained. Moreover, a time acquired by going back, by $(1/4) \times T1$ hours, from the time that the phase of $\pi/2$ is obtained can be detected as a time that a phase of 0 is obtained.

The synchronization signal output unit outputs, to the distance measurement calculating portion, a synchronization signal corresponding to a predetermined swing phase based on the swing phase of the movable unit 3 which is detected by the swing phase detector. Even if the swing cycle of the movable unit 3 fluctuates, consequently, it is possible to carry out a distance measurement calculation by always turning on measurement light for distance measurement corresponding to the predetermined swing phase.

Figure 15A:
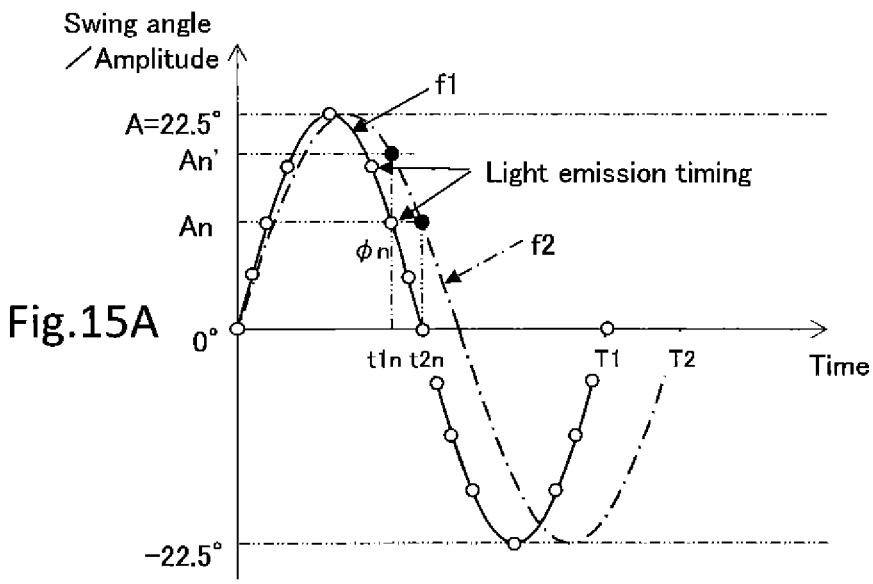
FIG. 15A is a chart for explaining distance measurement timing upon controlling light emission at equal intervals with respect to a swing angle direction, and control on distance measurement timing upon a fluctuation in a frequency.

As shown in FIG. 15A, if a phase in the case where the movable unit 3 swung at the frequency f1 needs to measure a distance in a direction of a swing angle An is represented by φn, it is preferable to measure a distance at a phase angle which satisfies $An = A \times \sin(\phi n)$. In the case of the frequency f1, a time t1n is obtained in accordance with $t1n = (\phi n/2\pi) \times T1$. At this time, it is preferable to measure a distance.

In the case where the resonance frequency fluctuates and the movable unit is swung at the frequency f2, the measurement light is sent in a direction having a swing angle An' if a distance is measured at the same time t1n. Consequently, it is impossible to measure a distance in an intended direction. Also in this case, the phase φn which is to be subjected to the distance measurement is identical. Therefore, a measurement time t2n in the case of the frequency f2 can be found by $t2n = (\phi n/2\pi) \times T2$.

Based on the time for the phase of 0 detected by the phase detector 320 and a time for one cycle, thus, it is possible to calculate the time an corresponding to the phase φn in the case of the frequency f1, thereby outputting a synchronization signal. Also in the case where the frequency fluctuates to f2, it is possible to measure a distance in the predetermined phase φn at a swing angle An by outputting the synchronization signal to the time t2n corresponding to the phase φn.

In other words, the swing angle of the movable unit 3 fluctuates into An' when the amplitude controller 330 controls the frequency to be the frequency f2. If the synchronization signal is output, by the synchronization signal output unit, at the time t2n that the movable unit 3 has the phase φn, however, the distance measurement calculating portion can turn on measurement light at the time t2n that the swing angle of the movable unit 3 is An.

Figure 15B:
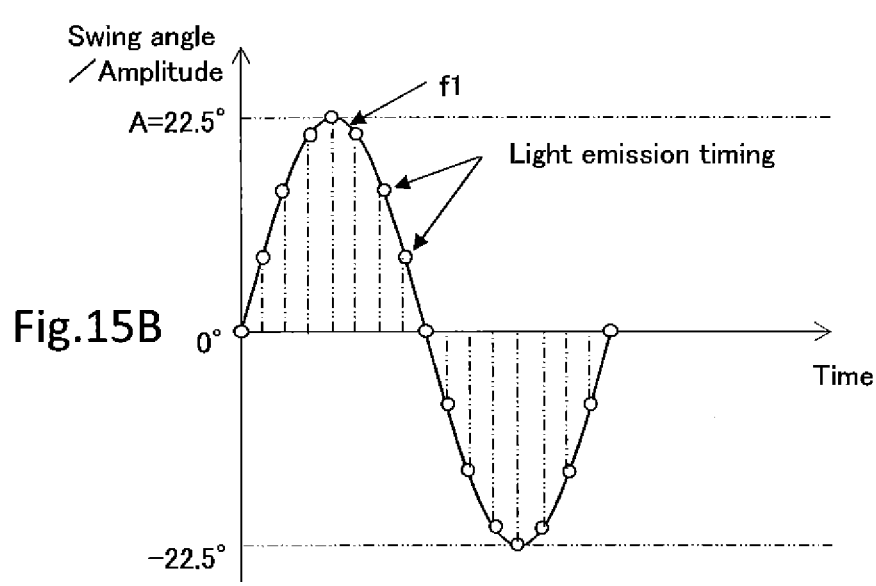
FIG. 15B is a chart for explaining control on distance measurement timing upon controlling the light emission at equal intervals with respect to a phase direction.

FIG. 15A is a chart showing distance measurement timing in the case where light emission control is carried out at equal intervals with respect to a swing angle direction or a scanning direction, and FIG. 15B is a chart showing distance measurement timing in the case where the light emission control is carried out at equal intervals in a phase direction or on a time base. A phase or time for the execution of the light emission control is properly determined depending on an intended use and is not restricted to the example. Moreover, light emission timing may be preset, to a storage device in a control device, as information about a phase in which the light emission is to be executed or information corresponding thereto or may be input from an external control device or the like.

If there are provided a swing phase detector for detecting a swing phase of the movable unit 3 and a phase signal output unit for outputting the swing phase detected by the swing phase detector in synchronization with a measurement time through measurement light, moreover, it is possible to grasp the swing phase of the movable unit which is synchronized with the measurement time through the measurement light on the basis of the phase signal output from the phase signal output unit. Therefore, it is possible to specify a corresponding direction to a measured value accurately.

In the case where the miniature machine is set to be a light scanning mechanism in a vertical direction and is combined with another driving device in a horizontal direction to carry out two-dimensional light scanning, furthermore, it is necessary to perform control in order to scan phases of the two scanning mechanisms synchronously when detection accuracy needs to be constantly maintained. If the phase signal output unit is provided also in this case, it is possible to easily control a phase of the driving device in the horizontal direction by using the phase signal. The phase signal can be selected appropriately if it is a signal related to a phase, for example, a synchronization signal indicative of a phase of zero, time information about one cycle or the like.

Both the synchronization signal output unit and the phase signal output unit may be provided in the swing control device 350, and a switching portion (for example, a changeover switch) for switching either of them to function may be provided.

The specific circuits constituting the respective functional blocks in the swing control device 350 are not particularly restricted but it is possible to properly constitute them by using an analog signal circuit, a digital signal circuit, a gate array, a microcomputer and the like which are well-known.

What is claimed is:

1. A method of manufacturing a miniature machine including at least one movable unit, a fixed unit and paired beams for supporting the movable unit at the respective ends with respect to the fixed unit and capable of swinging the movable unit about an axis with the beams serving as torsional rotation axes, the method comprising the steps of:
positioning and disposing a metal elastic member in the fixed unit and/or the movable unit in a state in which the metal bar and each of the pads are supported by the frame, the metal elastic member including a metal bar molded to have a sectional area of 1 mm$^2$ or less by using a physical or chemical processing method excluding a mechanical processing method and having a predetermined length which swings the movable unit, a fixed unit pad that is provided at a first end of the metal bar and is fixed to the fixed unit, a movable unit pad that is provided at a second end of the metal bar and is fixed to the movable unit, and a frame, and having a pair of the metal bars disposed symmetrically on a straight line in the frame and a plurality of support units for coupling the frame to each of the pads formed integrally by using the physical or chemical processing method excluding the mechanical processing method;
fixing the fixed unit and/or the movable unit to each of the pads; and
cutting each of the support units to separate the frame after fixing the fixed unit and/or the movable unit to each of the pads.

2. A swing control device for controlling to swing a movable unit of a miniature machine,
for the miniature machine including at least one movable unit having a coil formed thereon, at least one fixed unit having a magnetic field forming unit provided thereon, and paired beams having a metal bar which is molded to have a sectional area of 1 mm$^2$ or less by using a physical or chemical processing method excluding a mechanical processing method, supporting the movable unit at the respective ends with respect to the fixed unit and supporting the movable unit so as to be swingable about an axis with the metal bar serving as a torsional rotation axis, that is, paired beams to serve as a conductor for flowing current to the coil and to serve as a spring for returning the movable unit to a reference position, and configured in such a manner that the movable unit is swung by electromagnetic force generated by a current flowing to the coil via the beam and a magnetic field formed by the magnetic field forming unit,
the swing control device comprising:
an amplitude detector including a light receiving portion for monitoring which detects a monitor light guided from the movable unit, that is, a monitor light along an optical axis having an angle varied with a swinging movement of the movable unit in an inclined direction to a swinging direction with respect to a swinging center direction of the movable unit, an amplitude detecting circuit for detecting two sections having a long cycle section and a short cycle section which constitute one swing cycle of the movable unit based on the monitor light detected by the light receiving portion for monitoring; and
an amplitude controller for variably controlling a frequency while maintaining a current value of a current to be applied to the coil in such a manner that a time ratio of the long cycle section and the short cycle section which are detected by the amplitude detector has a target value.

3. The swing control device according to claim 2, wherein
a first light deflecting surface for deflecting measurement light irradiated from a measurement light source and scanning a measurement space with the measurement light and for deflecting reflected light of the measurement light toward a light receiving portion for measurement is formed on a surface of the movable unit, and a second light deflecting surface is formed on a back face of the movable unit, and
the amplitude detector further includes a monitor light source for irradiating a monitor light toward the second light deflecting surface, and reflected light thereof is received by the light receiving portion for monitoring.

4. The swing control device according to claim 3 more comprising:
a swing phase detector for detecting a swing phase of the movable unit; and
a synchronization signal output unit for regulating a measurement time through the measurement light in synchronization with the swing phase detected by the swing phase detector.

5. The swing control device according to claim 3 more comprising:
a swing phase detector for detecting a swing phase of the movable unit; and
a phase signal output unit for outputting the swing phase detected by the swing phase detector in synchronization with a measurement time through the measurement light.

6. A swing control method of controlling to swing a movable unit of a miniature machine,
for the miniature machine including at least one movable unit having a coil formed thereon, at least one fixed unit having a magnetic field forming unit provided thereon, and paired beams having a metal bar which is molded to have a sectional area of 1 mm$^2$ or less by using a physical or chemical processing method excluding a mechanical processing method, supporting the movable unit at the respective ends with respect to the fixed unit and supporting the movable unit so as to be swingable about an axis with the metal bar serving as a torsional rotation axis, that is, paired beams to serve as a conductor for flowing current to the coil and to serve as a spring for returning the movable unit to a reference position, and configured in such a manner that the movable unit is swung by electromagnetic force generated by a current flowing to the coil via the beam and a magnetic field formed by the magnetic field forming unit,
the method comprising the steps of:
detecting a monitor light guided from the movable unit, that is, a monitor light along an optical axis having an angle varied with a swinging movement of the movable unit in an inclined direction to a swinging direction with respect to a swinging center direction of the movable unit;

detecting two sections having a long cycle section and a short cycle section which constitute one swing cycle of the movable unit based on the detected monitor light; and variably controlling a frequency while maintaining a current value of a current to be applied to the coil in such a manner that a time ratio of the long cycle section and the short cycle section which are detected has a target value.

7. A metal elastic member to be used for paired beams for supporting a movable unit at respective ends with respect to a fixed unit in a miniature machine including at least one movable unit, the fixed unit and the beams, and capable of swinging the movable unit about an axis with the beams serving as torsional rotation axes, the metal elastic member comprising:

a metal bar molded to have a sectional area of 1 mm$^2$ or less by using a physical or chemical processing method excluding a mechanical processing method and having a predetermined length which swings the movable unit;

a fixed unit pad that is provided at a first end of the metal bar and is fixed to the fixed unit; and a movable unit pad that is provided at a second end of the metal bar and is fixed to the movable unit, wherein the metal elastic member is configured by either a stainless material, a carbon tool steel material, or a cold-reduced carbon steel sheet material which are rolled by a tension annealing method.

8. The metal elastic member according to claim 7, wherein the physical or chemical processing method includes a focused ion beam method, an etching method, and a plating method.

9. A method elastic member to be used for paired beams for supporting a movable unit at respective ends with respect to a fixed unit in a miniature machine including at least one movable unit, the fixed unit and the beams, and capable of swinging the movable unit about an axis with the beams serving as torsional rotation axes, the metal elastic member comprising:

a metal bar molded to have a sectional area of 1 mm$^2$ or less by using a physical or chemical processing method excluding a mechanical processing method and having a predetermined length which swings the movable unit;

a fixed unit pat that is provided at a first end of the metal bar and is fixed to the fixed unit; and a movable unit pad that is provided at a second end of the metal bar and is fixed to the movable unit, wherein a frame, a pair of the metal bars disposed symmetrically on a straight line in the frame, and a plurality of support units for coupling the frame to each of the pads are formed integrally by using the physical or chemical processing method excluding the mechanical processing method.

10. The metal elastic member according to claim 9, wherein the physical or chemical processing method includes a focused ion beam method, an etching method, and a plating method.

11. A miniature machine comprising:

a movable unit;

a coil formed in the movable unit;

a fixed unit;

a magnetic field forming unit provided in the fixed unit; and paired beams including a metal bar which is molded to have a sectional area of 1 mm$^2$ or less by using a physical or chemical processing method excluding a mechanical processing method, supporting the movable unit at the respective ends with respect to the fixed unit and supporting the movable unit so as to be swingable about an axis with the metal bar serving as a torsional rotation axis, a beam of the paired beams serving as a supporter of the movable unit, a conductor for flowing current to the coil, and a spring for returning the movable unit to a reference position, wherein the movable unit is swung by electromagnetic force generated by a current flowing to the coil via the beam and a magnetic field formed by the magnetic field forming unit, and the beam is configured by either a stainless material, a carbon tool steel material, or a cold-reduced carbon steel sheet material which are rolled by a tension annealing method.

12. The miniature machine according to claim 11, wherein the physical or chemical processing method includes a focused ion beam method, an etching method, and a plating method.

13. The miniature machine according to claim 11, further comprising a light deflecting surface formed in the movable unit and reflecting incident light to scan.

* * * * *